(12) United States Patent
Zhamu et al.

(10) Patent No.: US 11,325,349 B2
(45) Date of Patent: May 10, 2022

(54) GRAPHITIC FILM-BASED ELASTIC HEAT SPREADERS

(71) Applicant: Global Graphene Group, Inc., Dayton, OH (US)

(72) Inventors: Aruna Zhamu, Springboro, OH (US); Yanbo Wang, Miamisburg, OH (US); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 0 days.

(21) Appl. No.: 16/877,773

(22) Filed: May 19, 2020

(65) Prior Publication Data

US 2021/0362471 A1 Nov. 25, 2021

(51) Int. Cl.
*B32B 9/04* (2006.01)
*H05K 7/20* (2006.01)
*B32B 7/12* (2006.01)

(52) U.S. Cl.
CPC .............. *B32B 9/04* (2013.01); *B32B 7/12* (2013.01); *H05K 7/2039* (2013.01); *B32B 2307/202* (2013.01); *B32B 2307/302* (2013.01); *B32B 2307/72* (2013.01); *B32B 2307/732* (2013.01); *B32B 2457/04* (2013.01)

(58) Field of Classification Search
CPC ............... B32B 9/04; B32B 2307/202; B32B 2307/302; B32B 2307/72; B32B 2307/732; B32B 2457/04; B32B 7/12; H05K 7/2039
See application file for complete search history.

(56) References Cited

U.S. PATENT DOCUMENTS

| | | | |
|---|---|---|---|
| 2,798,878 | A | 7/1957 | Hummers |
| 7,071,258 | B1 | 7/2006 | Jang et al. |
| 9,233,850 | B2 | 1/2016 | Jang et al. |
| 2005/0271574 | A1 | 12/2005 | Jang et al. |
| 2008/0048152 | A1 | 2/2008 | Jang et al. |
| 2020/0116443 | A1* | 4/2020 | Lin ............... H05K 7/2039 |

OTHER PUBLICATIONS

Anderson et al., "The Use of Esters of N-Hydroxysuccinimide in Peptide Synthesis" J. Amer. Chem. Soc. (1964) vol. 86, No. 9, pp. 1839-1842.
Hummers et al., "Preparation of graphitic oxide" J. Am. Chem. Soc. (1958) vol. 80, p. 1339.
Karlicky et al., "Halogenated Graphenes: Rapidly Growing Family of Graphene Derivatives" ACS Nano (2013) vol. 7, No. 8, pp. 6434-6464.

* cited by examiner

*Primary Examiner* — Catherine A. Simone

(57) ABSTRACT

Provided is a laminated graphitic layer as an elastic heat spreader, the layer comprising: (A) a plurality of graphitic or graphene films prepared from (i) graphitization of a polymer film or pitch film, (ii) aggregation or bonding of graphene sheets, or (iii) a combination of (i) and (ii), wherein the graphitic or graphene film has a thermal conductivity of at least 200 W/mK, an electrical conductivity no less than 3,000 S/cm, and a physical density from 1.5 to 2.25 g/cm³; and (B) a conducting polymer network adhesive that bonds together the graphitic or graphene films to form the laminated graphitic layer; wherein the conductive polymer network adhesive is in an amount from 0.001% to 30% by weight and wherein the laminated graphitic layer preferably has a fully recoverable tensile elastic strain from 1% to 50% and an in-plane thermal conductivity from 100 W/mK to 1,750 W/mK.

22 Claims, 13 Drawing Sheets

Side view of a thermal film

Side view of a thermal film bent by 180 degrees

GRAPHITIC FILM-BASED ELASTIC HEAT SPREADERS

The present disclosure relates generally to the field of thermal films or heat spreaders and, more particularly, to a graphene-based highly elastic heat spreader films and a process for producing same.

BACKGROUND

Advanced thermal management materials are becoming more and more critical for today's microelectronic, photonic, and photovoltaic systems. As new and more powerful chip designs and light-emitting diode (LED) systems are introduced, they consume more power and generate more heat. This has made thermal management a crucial issue in today's high performance systems. Systems ranging from active electronically scanned radar arrays, web servers, large battery packs for personal consumer electronics, widescreen displays, and solid-state lighting devices all require high thermal conductivity materials that can dissipate heat more efficiently. Furthermore, many microelectronic devices (e.g. smart phones, flat-screen TVs, tablets, and laptop computers) are designed and fabricated to become increasingly smaller, thinner, lighter, and tighter. This further increases the difficulty of thermal dissipation. Actually, thermal management challenges are now widely recognized as the key barriers to industry's ability to provide continued improvements in device and system performance.

Heat sinks are components that facilitate heat dissipation from the surface of a heat source, such as a CPU or battery in a computing device, to a cooler environment, such as ambient air. Typically, heat generated by a heat source must be transferred through a heat spreader to a heat sink or ambient air. A heat sink is designed to enhance the heat transfer efficiency between a heat source and the air mainly through increased heat sink surface area that is in direct contact with the air. This design enables a faster heat dissipation rate and thus lowers the device operating temperatures. In a microelectronic device, a high thermal conductivity of a heat spreader is essential to fast transfer of heat from a heat source to a heat sink or ambient air.

Graphene sheets, also referred to as nano graphene platelets (NGPs), refer to single-layer or few-layer graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof. A few-layer graphene sheet contains 2-10 graphene planes (one atom thick hexagonal planes of carbon atoms).

Heat-spreading application of graphene-based films was first developed by our research group as early as 2007: Bor Z. Jang, et al. "Nano-scaled Graphene Plate Films and Articles," U.S. patent application Ser. No. 11/784,606 (Apr. 9, 2007); now U.S. Pat. No. 9,233,850 (Jan. 12, 2016). Foldable handheld devices (e.g. foldable or bendable smart phones) are getting more and more popular. A foldable smart phone may be folded and unfolded more than 10,000 times during the useful life of this phone. Individual components, such as heat spreaders, in these devices are required to be foldable as well. However, graphene-based thermal films (or any type of thermal films) have not been known to be capable of withstanding repeated bending deformations without significantly degrading desirable properties such as thermal conductivity and structural integrity.

The present disclosure was made to overcome the limitations of prior art heat spreader films outlined above.

SUMMARY

The present disclosure provides a laminated graphitic layer as an elastic heat spreader. In certain preferred embodiments, the layer comprises: (a) a plurality of graphitic films (e.g. prepared from graphitization of a polymer film or pitch film), graphene films (e.g. from aggregation or bonding of graphene sheets), or a combination of graphitic and graphene films, wherein the graphitic film has graphitic crystals substantially parallel to one another and parallel to a film plane, having an inter-graphene spacing less than 0.40 nm in the graphitic crystals, and wherein the graphitic or graphene film has a thermal conductivity of at least 200 W/mK (preferably at least 500 W/mK), an electrical conductivity no less than 3,000 S/cm, and a physical density from 1.5 to 2.25 g/cm$^3$, all measured without the presence of a polymer; and (b) a conducting polymer network adhesive that bonds together the graphitic or graphene films to form the laminated graphitic layer; wherein the conductive polymer network adhesive is in an amount from 0.001% to 30% by weight based on the total weight of the laminated graphitic layer; and wherein the laminated graphitic layer has an in-plane thermal conductivity from 100 W/mK to 1,750 W/mK.

The physical densities of the constituent graphitic films or graphene films are preferably greater than to 1.7 g/cm$^3$, more preferably greater than to 1.8 g/cm$^3$, still more preferably greater than to 1.9 g/cm$^3$, further more preferably greater than to 2.0 g/cm$^3$, and most preferably greater than to 2.1 g/cm$^3$.

The conducting polymer network adhesive typically is a thin film or coating disposed between two graphitic or graphene films. The adhesive film/coating thickness is preferably from 0.5 nm to 5 µm, more preferably from 1 nm to 1 µm, further preferably thinner than 100 nm and most preferably thinner than 10 nm.

The conducting polymer network preferably comprises chains of a conjugated polymer selected from polyacetylene, polythiophene, poly(3-alkylthiophenes), polypyrrole, polyaniline, poly(isothianaphthene), poly(3,4-ethylenedioxythiophene), alkoxy-substituted poly(p-phenylene vinylene), poly(2,5-bis(cholestanoxy) phenylene vinylene), poly(p-phenylene vinylene), poly(2,5-dialkoxy) paraphenylene vinylene, poly[(1,4-phenylene-1,2-diphenylvinylene)], poly (3',7'-dimethyloctyloxy phenylene vinylene), polyparaphenylene, polyparaphenylene, polyparaphenylene sulfide, polyheptadiyne, poly(3-hexylthiophene), poly(3-octylthiophene), poly(3-cyclohexylthiophene), poly(3-methyl-4-cyclohexylthiophene), poly(2,5-dialkoxy-1,4-phenyleneethynylene), poly(2-decyloxy-1,4-phenylene), poly(9,9-dioctylfluorene), polyquinoline, a derivative thereof, a copolymer thereof, or a combination thereof.

Further preferably, the conducting polymer network comprises a polyaniline hydrogel, polypyrrole hydrogel, or polythiophene hydrogel polymer.

Preferably and typically, the laminated graphitic layer has a fully recoverable tensile elastic strain from 1% to 50%. This high elasticity appears to be imparted to the laminated graphitic film by the conductive polymer network adhesive, which provides the laminated graphitic film with the ability to withstand repeated bending for a large number of cycles (bending for >90 degrees back and forth for typically 5,000-100,000 times without a failure).

The conductive polymer network adhesive as herein disclosed surprisingly can be made to behave like an elastomer or rubber that has a high elasticity, a high tensile elastic deformation value (2%-1,000%) that is fully recoverable. It is well-known in the art of materials science and engineering that, by definition, an "elastic deformation" is a deformation that is fully recoverable upon release of the mechanical load, and the recovery process is essentially instantaneous (no significant time delay). An elastomer, such as a vulcanized natural rubber, can exhibit a tensile elastic deformation from 2% up to 1,000% (10 times of its original length), more typically from 10% to 800%, and further more typically from 50% to 500%, and most typically from 100% to 300%. If you use two hands to stretch a rubber band from 5 cm to, say, 40 cm and then release the rubber band from one hand, the rubber band immediately snaps back to substantially the original length. Such a deformation (800% in this example) is fully recoverable and there is substantially no plastic deformation (no permanent deformation). It has been known that no materials other than elastomers or rubbers exhibit such a high-elasticity behavior.

For instance, although a metal typically has a high tensile ductility (i.e. can be extended to a large extent without breakage; e.g. from 10% to 200%), the majority of the deformation is plastic deformation (non-recoverable) and only a small amount of deformation is elastic deformation (i.e. the recoverable deformation being typically <1% and more typically <0.2%). Similarly, a non-elastomer polymer or plastic (thermoplastic or thermoset resin) may be able to stretch to a large extent, but most of the deformation is plastic deformation, a permanent deformation that is not recoverable upon release of the stress/strain. For instance, polyethylene (PE) may be able to get stretched to up to 200% under tensile load, but the majority (>98%) of such a deformation is non-recoverable, permanent deformation commonly referred to as the plastic deformation.

Conventional rubbers or elastomers are known to be highly elastic, but unfortunately are not electrically and thermally conductive. In contrast, the presently disclosed conducting polymer network adhesive is surprisingly both conductive and elastic.

Again, it may be noted that such a high elasticity characteristic enables the heat spreader film to be bent or fold back and forth tens of thousands of times without significantly degrading the thermal conductivity. The thermal conductivity, typically from 500 to 1,750 W/mk before the first bending, can maintain >80% (typically >90%) of the original thermal conductivity after repeated bending by 10000 times.

In the disclosed laminated graphitic layer, at least one of the graphene films comprises multiple graphene sheets that are substantially aligned to be parallel to one another, wherein the multiple graphene sheets contain graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

In some highly useful embodiments, the heat spreader film or laminated graphitic layer is in a thin film form having a thickness from 10 nm to 500 μm and the graphene sheets are substantially aligned parallel to a thin film plane. In some preferred embodiments, the heat spreader is in a thin film form having a thickness from 100 nm to 300 μm and graphene sheets being aligned parallel to a thin film plane.

The graphitic films can comprise flexible graphite sheets (flexible graphite foil), which typically has a thermal conductivity lower than 500 W/mK and more typically lower than 200 W/mK. Flexible graphite foil is not a preferred or desired graphitic film in the presently disclosed laminated graphitic layer.

However, in certain preferred embodiments, the graphitic film may be produced from a film of polymer or pitch, having a film thickness from 10 nm to 1 mm. The process may include subjecting the film to a heat treatment at a carbonization temperature from 300° C. to 1,500° C., followed by a graphitization procedure at a temperature greater than 2000° C. (preferably >2300° C., further preferably >2500° C., and most preferably >2800° C.) in an non-oxidizing atmosphere to graphitize the film for obtaining a porous graphitized film. This porous film is then compressed or roll-pressed to increase the density to 1.5-2.25 $g/cm^3$. In certain embodiments, the non-oxidizing atmosphere contains hydrogen gas, nitrogen gas, inert gas (e.g. He), or a combination thereof.

The starting polymer film for carbonization and graphitization is preferably selected from the group consisting of polyimide, polyamide, phenolic resin, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, poly(pyromellitimide), poly(p-phenylene-isophthalamide), poly(m-phenylene-zoimidazole), poly(phenylene-benzobisimidazole), polyacrylonitrile, and combinations thereof.

In certain embodiments, the pitch film is selected from a film of petroleum pitch, coal tar pitch, a polynuclear hydrocarbon, or a combination thereof. The polynuclear hydrocarbon may be selected from naphthalene, anthracene, phenanthrene, tetracene, chrysene, triphenylene, pyrene, pentacene, benzo-pyrene, corannulene, benzo-perylene, coronene, ovalene, benzo-fluorene, a derivative thereof having a substituent on a ring structure thereof, a chemical derivative thereof, or a combination thereof.

Typically, the disclosed laminated graphitic layer or heat spreader film, if comprising mainly graphitic films bonded by the conductive polymer gel adhesive, has a tensile strength no less than 80 MPa, a tensile modulus no less than 20 GPa, a thermal conductivity no less than 500 W/mK, and/or an electrical conductivity no less than 5,000 S/cm, all measured along a thin film plane direction. Typically and preferably, the elastic heat spreader film has a tensile strength no less than 150 MPa, a tensile modulus no less than 30 GPa, a thermal conductivity no less than 800 W/mK, and/or an electrical conductivity no less than 8,000 S/cm, all measured along a thin film plane direction. In many cases, the elastic heat spreader film has a tensile strength no less than 200 MPa, a tensile modulus no less than 60 GPa, a thermal conductivity no less than 1,200 W/mK, and/or an electrical conductivity no less than 12,000 S/cm, all measured along a thin film plane direction. Some of the disclosed heat spreader films exhibit a tensile strength no less than 300 MPa, a tensile modulus no less than 120 GPa, a thermal conductivity no less than 1,500 W/mK, and/or an electrical conductivity no less than 20,000 S/cm, all measured along a thin film plane direction.

The constituent graphene films may be produced by simply aggregating and bonding multiple graphene sheets together using a compression or roll-pressing procedure. In certain embodiments, the procedure of forming a layer of an aggregate or cluster of multiple oriented/aligned graphene sheets comprises forming a graphene dispersion containing multiple graphene sheets dispersed in a liquid medium, followed by a procedure of forming such a dispersion into a wet layer using a procedure selected from coating, casting, spraying, printing, forced assembling and orienting procedure, or a combination thereof. Such a procedure typically involves removal of the liquid medium to form a dry layer of graphene sheets. This day layer of graphene sheets (pristine graphene, graphene oxide, functionalized graphene sheets, etc.) may be subsequently subjected to a heat treatment at a temperature from 100° C. to 3,000° C. The heat treated layer may then be compressed or roll-pressed to increase the density to 1.6-2.25 g/cm$^3$.

In certain preferred embodiments, the graphene sheets contain mostly single-layer graphene (90% to 100%) having an average number of layers between 1 and 2. In certain embodiments, the graphene sheets contain single-layer graphene and few-layer graphene sheets having an average number of layers less than 5. Few-layer graphene is commonly defined as those graphene sheets having 2-10 layers of graphene planes.

In certain embodiments, the graphene sheets contain a functional group attached thereto to make the graphene sheets exhibit a negative Zeta potential having a value from −55 mV to −0.1 mV.

The graphene sheets may contain a chemical functional group selected from alkyl or aryl silane, alkyl or aralkyl group, hydroxyl group, carboxyl group, epoxide, carbonyl group, amine group, sulfonate group (—SO$_3$H), aldehydic group, quinoidal, fluorocarbon, or a combination thereof.

In certain embodiments, the graphene sheets contain chemically functionalized graphene sheets having a chemical functional group selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

The graphene sheets may contain a chemical functional group selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—NR'$_2$, R'SH, R'CHO, R'CN, R'X, R'N$^+$(R')$_3$X$^-$, R'SiR'$_3$, R'Si(—OR'—)$_y$R'$_{3-y}$, R'Si(—O—SiR'$_2$—)OR', R'—R", R'—N—CO, (C$_2$H$_4$O—)$_w$H, (—C$_3$H$_6$O—)$_w$H, (—C$_2$H$_4$O)$_w$—R', (C$_3$H$_6$O)$_w$—R', R', and w is an integer greater than one and less than 200.

Typically, the disclosed heat spreader film (or laminated graphitic layer) comprising primarily graphene films has a tensile strength no less than 100 MPa, a tensile modulus no less than 25 GPa, a thermal conductivity no less than 500 W/mK, and/or an electrical conductivity no less than 5,000 S/cm, all measured along a thin film plane direction. Typically and preferably, the metal matrix nanocomposite has a tensile strength no less than 300 MPa, a tensile modulus no less than 50 GPa, a thermal conductivity no less than 800 W/mK, and/or an electrical conductivity no less than 8,000 S/cm, all measured along a thin film plane direction. In many cases, the elastic heat spreader film has a tensile strength no less than 400 MPa, a tensile modulus no less than 150 GPa, a thermal conductivity no less than 1,200 W/mK, and/or an electrical conductivity no less than 12,000 S/cm, all measured along a thin film plane direction. Some of the disclosed heat spreader films exhibit a tensile strength no less than 500 MPa, a tensile modulus no less than 250 GPa, a thermal conductivity no less than 1,500 W/mK, and/or an electrical conductivity no less than 20,000 S/cm, all measured along a thin film plane direction.

The present disclosure also provides an electronic device containing the aforementioned heat spreader film or laminated graphitic layer as a component (e.g. as a thermal management element). Additionally, the present disclosure provides a structural member containing the disclosed heat spreader film as a load-bearing and thermal management element.

Also disclosed herein is a process for producing a laminated graphitic layer which itself is an elastic heat spreader film or can be a part of a heat spreader film. In some embodiments, the process comprises:
 (a) preparing a plurality of graphitic and/or graphene films, each having a thickness typically from 2 nm to 500 µm (more typically from 100 nm to 200 µm, further more typically from 1 µm to 100 µm, and most typically from 10 µm to 50 µm);
 (b) applying or disposing a thin film or coating of a reacting adhesive solution (a precursor to a conducting polymer network) at least between two of the graphitic or graphene films, wherein the reaction solution comprises an oligomer or a monomer, an initiator or catalyst, a curing or cross-linking agent, and/or a liquid solvent (not all the listed ingredients have to be present; only need those ingredients that result in a crosslinked conducting polymer network); and
 (c) laminating the plurality of graphitic and/or graphene films together and polymerizing or crosslinking the reacting adhesive solution that forms a conducting polymer network for bonding the films together to obtain the laminated graphitic layer.

Preferably, the conductive polymer network is in an amount from 0.001% to 20% by weight based on the total laminated graphitic layer weight. The laminated graphitic layer typically and preferably has a fully recoverable tensile elastic strain from 2% to 50% and an in-plane thermal conductivity from 200 W/mK to 1,750 W/mK.

The graphene film may be made by a procedure of forming a layer of an aggregate or cluster of multiple oriented/aligned graphene sheets that are substantially parallel to one another.

In some embodiments, (a) comprises a procedure of carbonizing and graphitizing a polymer film or pitch film to obtain a graphitic film.

The multiple graphene sheets preferably contain single-layer or few-layer graphene sheets selected from a pristine graphene material (defined as graphene having essentially zero % (<0.001% by weight) of non-carbon elements), or a non-pristine graphene material (defined as the graphene material having 0.001% to 25% by weight of non-carbon elements) wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

The process may further comprise a sub process of compressing the graphene film or graphitic film, wherein the multiple graphene sheets in the graphene film or graphitic crystals in the graphitic film are substantially aligned to be parallel to one another.

In the disclosed process, in some embodiments, (a) comprises providing a layer of an aggregate or cluster of multiple graphene sheets comprises a procedure selected from coating, casting, air-assisted clustering, liquid assisted clustering, spraying, printing, or a combination thereof. The coating procedure may be selected from vapor deposition, chemical coating, electrochemical coating or plating, spray-coating, painting, brushing, roll-to-roll coating, physical coating, or a combination thereof.

Preferably, the roll-to-roll coating is selected from air knife coating, Anilox coating, Flexo coating, gap coating or knife-over-roll coating, gravure coating, hot melt coating, immersion dip coating, kiss coating, metering rod or Meyer bar coating, roller coating, silk screen coating or rotary screen coating, slot-die coating, extrusion coating, inkjet printing, or a combination thereof.

The deposition of a reacting adhesive solution may be conducted by dispensing or deposition this liquid solution onto one surface or two surfaces of a pre-made graphitic film or graphene film using casting, coating, spraying, painting, etc. This can be readily done in a roll-to-roll manner. A reactive adhesive-coated surface is intended to be combined with another graphitic or graphene film. Multiple films can be laminated together using well-known lamination procedures.

The process may further comprise implementing the elastic heat spreader film into a device as a thermal management element in this device.

DESCRIPTION OF THE PREFERRED EMBODIMENTS

Figure 1:
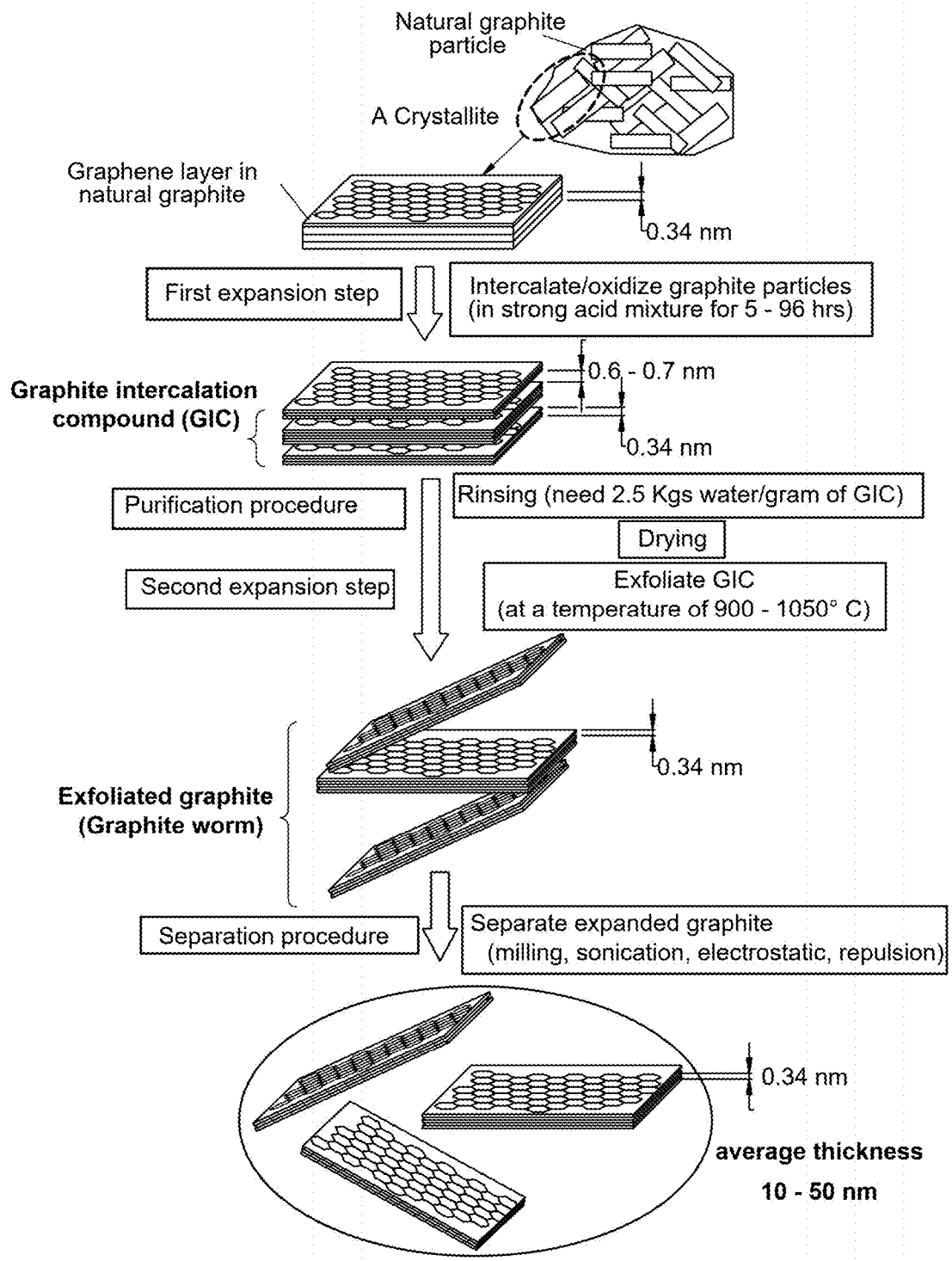
FIG. 1 A flow chart showing the most commonly used process for producing oxidized graphene sheets that entails chemical oxidation/intercalation, rinsing, and high-temperature exfoliation procedures.

The present disclosure provides a laminated graphitic layer as an elastic heat spreader. In certain preferred embodiments, the layer comprises: (a) a plurality of graphitic films (e.g. prepared from graphitization of a polymer film or pitch film), graphene films (e.g. from aggregation or bonding of graphene sheets), or a combination of graphitic and graphene films, wherein the graphitic film has graphitic crystals substantially parallel to one another and parallel to a film plane, having an inter-graphene spacing less than 0.40 nm in the graphitic crystals, and wherein the graphitic or graphene film has a thermal conductivity of at least 200 W/mK, an electrical conductivity no less than 3,000 S/cm, and a physical density from 1.5 to 2.25 g/cm$^3$, all measured without the presence of a polymer; and (b) a conducting polymer network adhesive that bonds together the graphitic or graphene films to form the laminated graphitic layer; wherein the conductive polymer network adhesive is in an amount from 0.001% to 30% by weight based on the total weight of the laminated graphitic layer; and wherein the laminated graphitic layer has an in-plane thermal conductivity from 100 W/mK to 1,750 W/mK.

The physical densities of the constituent graphitic films or graphene films are preferably greater than to 1.7 g/cm$^3$, more preferably greater than to 1.8 g/cm$^3$, still more preferably greater than to 1.9 g/cm$^3$, further more preferably greater than to 2.0 g/cm$^3$, and most preferably greater than to 2.1 g/cm$^3$.

The conducting polymer network adhesive typically is a thin film or coating disposed between two graphitic or graphene films. The adhesive film/coating thickness is preferably from 0.5 nm to 5 µm, more preferably from 1 nm to 1 µm, further preferably thinner than 100 nm and most preferably thinner than 10 nm.

The conducting polymer network preferably comprises chains of a conjugated polymer selected from polyacetylene, polythiophene, poly(3-alkylthiophenes), polypyrrole, polyaniline, poly(isothianaphthene), poly(3,4-ethylenedioxythiophene), alkoxy-substituted poly(p-phenylene vinylene), poly(2,5-bis(cholestanoxy) phenylene vinylene), poly(p-phenylene vinylene), poly(2,5-dialkoxy) paraphenylene vinylene, poly[(1,4-phenylene-1,2-diphenylvinylene)], poly (3',7'-dimethyloctyloxy phenylene vinylene), polyparaphenylene, polyparaphenylene, polyparaphenylene sulfide, polyheptadiyne, poly(3-hexylthiophene), poly(3-octylthiophene), poly(3-cyclohexylthiophene), poly(3-methyl-4-cyclohexylthiophene), poly(2,5-dialkoxy-1,4-phenyleneethynylene), poly(2-decyloxy-1,4-phenylene), poly(9,9-dioctylfluorene), polyquinoline, a derivative thereof, a copolymer thereof, or a combination thereof.

Further preferably, the conducting polymer network comprises a polyaniline hydrogel, polypyrrole hydrogel, or polythiophene hydrogel polymer.

The conducting polymer network adhesive, upon curing, preferably has a high elasticity (high elastic deformation value). An elastic deformation is a deformation that is fully recoverable and the recovery process is essentially instantaneous (no significant time delay). A conventional rubber or elastomer, such as a vulcanized natural rubber, can exhibit an elastic deformation from 2% up to 1,000% (10 times of its original length), more typically from 10% to 800%, and further more typically from 50% to 500%, and most typically and desirably from 100% to 500%. However, these elastomers and rubbers are not electrically or thermal conducting. In contrast, the presently disclosed conducting polymer network adhesive is surprisingly both conductive and elastic.

Again, it may be noted that such a high elasticity characteristic enables the heat spreader film (comprising the laminated graphitic layer) to be bent or fold back and forth tens of thousands of times without significantly degrading the thermal conductivity. The thermal conductivity, typically from 500 to 1,750 W/mk before the first bending, can maintain >80% (typically >90%) of the original thermal conductivity after repeated bending by 10000 times.

It may be noted that although a metal or a plastic material typically has a high ductility (i.e. can be extended to a large extent without breakage), the majority of the deformation is plastic deformation (i.e. non-recoverable, permanent deformation) and only a small amount (typically <1% and more typically <0.2%) is elastic deformation.

Preferably, in the above-cited embodiments, the conducting network polymer adhesive rubber is in an amount from 0.001% to 30% by weight, more preferably from 0.01% to 10% and further more preferably from 0.1% to 1%.

There are two preferred types of constituent films that, with the conductive polymer network adhesive between films, essentially constitute the laminated graphitic layer. The two types are graphitic films produced from polymer or pitch films and graphene films produced from oriented graphene sheets aggregated and/or bonded together. The graphitic films can comprise flexible graphite sheets (flexible graphite foil). There can be some conductive additive (e.g. CNTs, graphene sheets, expanded graphite flakes, etc.) dispersed in the conductive polymer network adhesive.

Figure 2A:
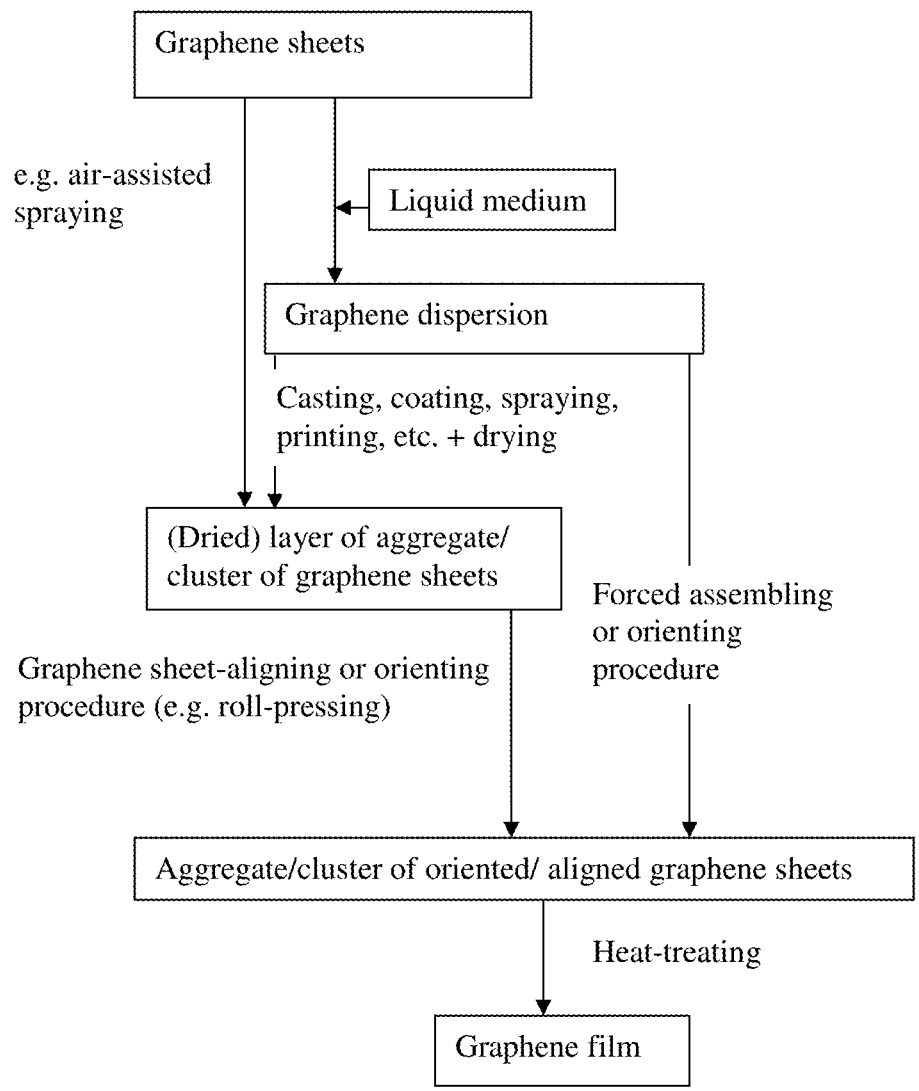
FIG. 2(A) Schematic of a process for producing graphene films containing an aggregate/cluster of oriented/aligned graphene sheets, according to certain embodiments of the disclosure.
Figure 2B:
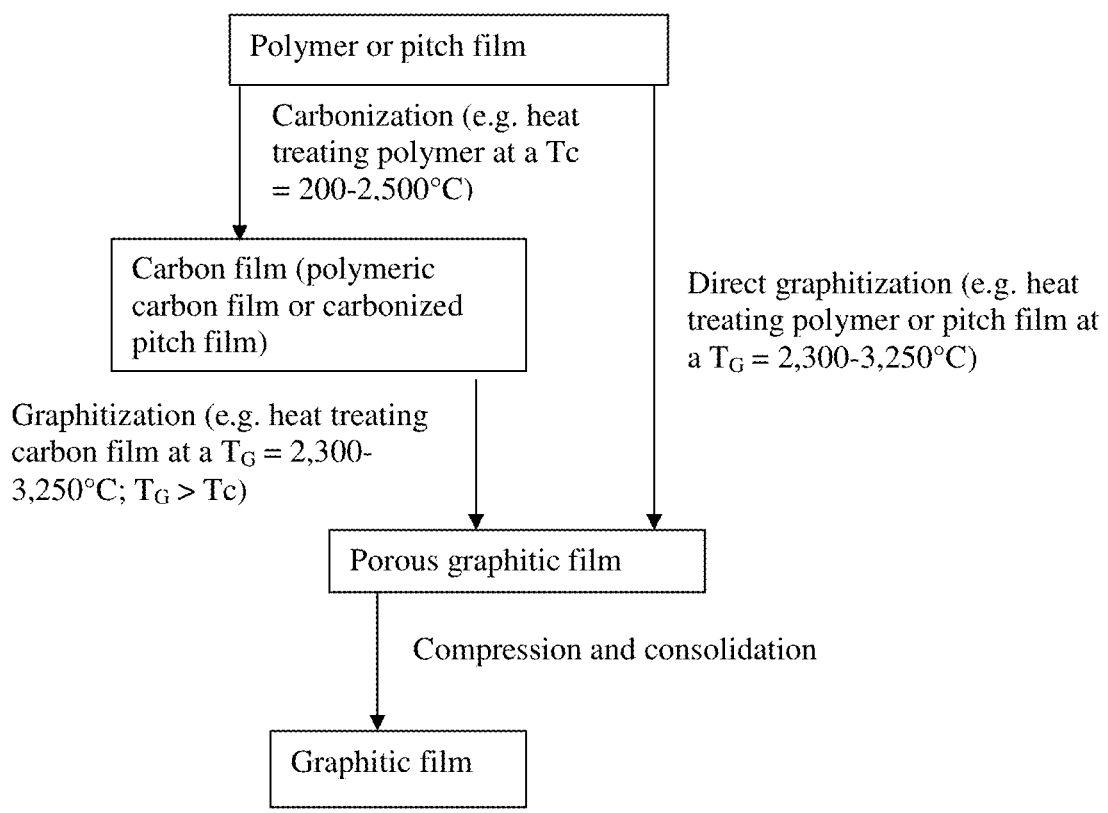
FIG. 2(B) Schematic of a process for producing graphitic films from polymer or pitch films, according to certain embodiments of the disclosure.

In certain embodiments, as schematically illustrated in FIG. 2(B), a recommended process for producing a graphitic film comprises: (a) providing one film of polymer or pitch, having a film thickness no less than 5 nm (preferably from 10 nm to 5 mm, more preferably from 100 nm to 1 mm, further more preferably from 1 to 100 μm); (b) subjecting the at least one film to a heat treatment at a carbonization temperature of Tc=200-2,500° C. (more typically 300-1,500° C.) and then a graphitization temperature greater than 2000° C. (preferably >2300° C., further preferably >2500° C., and most preferably >2800° C.) in an non-oxidizing atmosphere to graphitize the film for obtaining a porous graphitized film; and (c) compressing the porous film to produce the graphitic film. Graphitization leads to the formation of graphitic crystals inside the film.

The graphitization treatment may be preceded by a carbonization treatment of the polymer or pitch film, as illustrated in the left-hand side of FIG. 2(B). In other words, the polymer or pitch film is carbonized (e.g. at a carbonization temperature, Tc=200-2,500° C.) to obtain a polymeric carbon or carbonized pitch, which is then graphitized at a graphitization temperature, $T_G$ (e.g. $T_G$=2,300-3,250° C.; $T_G$>Tc). The product of the heat treatment (carbonization and then graphitization or direct graphitization, bypassing the carbonization step) is a porous graphitic film, typically having surface and internal pores. A compression procedure is typically needed to increase the physical density to 1.5-2.2 g/cm$^3$.

In the disclosed process, the polymer film is preferably selected from the group consisting of polyimide, polyamide, phenolic resin, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, poly(pyromellitimide), poly(p-phenylene-isophthalamide), poly(m-phenylenezoimidazole), poly(phenylene-benzobisimidazole), polyacrylonitrile, and combinations thereof.

In certain embodiments, the non-oxidizing atmosphere contains hydrogen gas, nitrogen gas, an inert gas (e.g. He), or a combination thereof.

In certain embodiments, the pitch film is selected from a film of petroleum pitch, coal tar pitch, a polynuclear hydrocarbon, or a combination thereof. The polynuclear hydrocarbon may be selected from naphthalene, anthracene, phenanthrene, tetracene, chrysene, triphenylene, pyrene, pentacene, benzo-pyrene, corannulene, benzo-perylene, coronene, ovalene, benzo-fluorene, a derivative thereof having a substituent on a ring structure thereof, a chemical derivative thereof, or a combination thereof.

Preferably, the film of polymer or pitch further comprises from 0.01% to 50% by weight of multiple graphene sheets dispersed therein to form a graphene-enhanced polymer or pitch film, and wherein the graphene sheets are selected from pristine graphene, oxidized graphene, reduced graphene oxide, fluorinated graphene, hydrogenated graphene, doped graphene, chemically functionalized graphene, or a combination thereof. Graphene sheets may also be referred to as nano graphene platelets (NGPs).

In some embodiments, the film of polymer or pitch further comprises from 0.01% to 50% by weight of expanded graphite flakes or exfoliated graphite dispersed therein prior to the heat treatments.

The polymer or pitch film may comprise a combination of expanded graphite flakes and graphene sheets dispersed therein prior to the heat treatment. The presence of graphene sheets appear to promote the graphitization process by decreasing the required graphitization temperature and accelerate the formation of graphitic crystals or graphite single crystals.

In certain embodiments, the process further comprises, prior to (b), a procedure of carbonizing the film at a temperature selected from 300 to 2,500° C., and wherein the graphitization temperature is from 2,500° C. to 3,250° C.

The second type of films that can be incorporated in a laminated graphitic layer is the graphene film, which is typically made from various types of multiple graphene sheets. The multiple graphene sheets typically contain single-layer or few-layer graphene sheets selected from a pristine graphene material having essentially zero % of non-carbon elements, or a non-pristine graphene material having 0.001% to 25% by weight of non-carbon elements wherein the non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof and wherein the chemically functionalized graphene is not graphene oxide and the graphene sheets are spaced by the matrix material having an average spacing from 1 nm to 300 nm.

The preparation of graphene sheets and graphene dispersions is described as follows: Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nanotubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted on Oct. 21, 2002; (2) B. Z. Jang, et al. "Process for Producing Nano-scaled Graphene Plates," U.S. patent application Ser. No. 10/858,814 (Jun. 3, 2004) (U.S. Pat. Pub. No. 2005/0271574 now abandoned); and (3) B. Z. Jang, A. Zhamu, and J. Guo, "Process for Producing Nano-scaled Platelets and Nanocomposites," U.S. patent application Ser. No. 11/509,424 (Aug. 25, 2006) (U.S. Pat. Pub. No. 2008/0048152 now abandoned).

A single-layer graphene sheet is composed of carbon atoms occupying a two-dimensional hexagonal lattice. Multi-layer graphene is a platelet composed of more than one graphene plane. Individual single-layer graphene sheets and multi-layer graphene platelets are herein collectively called nano graphene platelets (NGPs) or graphene materials. NGPs include pristine graphene (essentially 99% of carbon atoms), slightly oxidized graphene (<5% by weight of oxygen), graphene oxide (≥5% by weight of oxygen), slightly fluorinated graphene (<5% by weight of fluorine), graphene fluoride ((≥5% by weight of fluorine), other halogenated graphene, and chemically functionalized graphene.

NGPs have been found to have a range of unusual physical, chemical, and mechanical properties. For instance, graphene was found to exhibit the highest intrinsic strength and highest thermal conductivity of all existing materials. Although practical electronic device applications for graphene (e.g., replacing Si as a backbone in a transistor) are not envisioned to occur within the next 5-10 years, its application as a nano filler in a composite material and an electrode material in energy storage devices is imminent. The availability of processable graphene sheets in large quantities is essential to the success in exploiting composite, energy, and other applications for graphene.

A commonly used approach (FIG. 1) entails treating natural graphite powder with an intercalant and an oxidant (e.g., concentrated sulfuric acid and nitric acid, respectively) to obtain a graphite intercalation compound (GIC) or, actually, graphite oxide (GO). [William S. Hummers, Jr., et al., Preparation of Graphitic Oxide, Journal of the American Chemical Society, 1958, p. 1339.] Prior to intercalation or oxidation, graphite has an inter-graphene plane spacing of approximately 0.335 nm ($L_d=½d_{002}=0.335$ nm). With an intercalation and oxidation treatment, the inter-graphene spacing is increased to a value typically greater than 0.6 nm. This is the first expansion stage experienced by the graphite material during this chemical route. The obtained GIC or GO is then subjected to further expansion (often referred to as exfoliation) using either a thermal shock exposure or a solution-based, ultrasonication-assisted graphene layer exfoliation approach.

In the thermal shock exposure approach, the GIC or GO is exposed to a high temperature (typically 800-1,050° C.) for a short period of time (typically 15 to 60 seconds) to exfoliate or expand the GIC or GO for the formation of exfoliated or further expanded graphite, which is typically in the form of a "graphite worm" composed of graphite flakes that are still interconnected with one another. This thermal shock procedure can produce some separated graphite flakes or graphene sheets, but normally the majority of graphite flakes remain interconnected. Typically, the exfoliated graphite or graphite worm is then subjected to a flake separation treatment using air milling, mechanical shearing, or ultrasonication in water. Hence, approach 1 basically entails three distinct procedures: first expansion (oxidation or intercalation), further expansion (or "exfoliation"), and separation.

In the solution-based separation approach, the expanded or exfoliated GO powder is dispersed in water or aqueous alcohol solution, which is subjected to ultrasonication. It is important to note that in these processes, ultrasonification is used after intercalation and oxidation of graphite (i.e., after first expansion) and typically after thermal shock exposure of the resulting GIC or GO (after second expansion). Alternatively, the GO powder dispersed in water is subjected to an ion exchange or lengthy purification procedure in such a manner that the repulsive forces between ions residing in the inter-planar spaces overcome the inter-graphene van der Waals forces, resulting in graphene layer separations.

In the aforementioned examples, the starting material for the preparation of graphene sheets or NGPs is a graphitic material that may be selected from the group consisting of natural graphite, artificial graphite, graphite oxide, graphite fluoride, graphite fiber, carbon fiber, carbon nano-fiber, carbon nano-tube, mesophase carbon micro-bead (MCMB) or carbonaceous micro-sphere (CMS), soft carbon, hard carbon, and combinations thereof.

Graphite oxide may be prepared by dispersing or immersing a laminar graphite material (e.g., powder of natural flake graphite or synthetic graphite) in an oxidizing agent, typically a mixture of an intercalant (e.g., concentrated sulfuric acid) and an oxidant (e.g., nitric acid, hydrogen peroxide, sodium perchlorate, potassium permanganate) at a desired temperature (typically 0-70° C.) for a sufficient length of time (typically 4 hours to 5 days). The resulting graphite oxide particles are then rinsed with water several times to adjust the pH values to typically 2-5. The resulting suspension of graphite oxide particles dispersed in water is then subjected to ultrasonication to produce a dispersion of separate graphene oxide sheets dispersed in water. A small amount of reducing agent (e.g. $Na_4B$) may be added to obtain reduced graphene oxide (RDO) sheets.

In order to reduce the time required to produce a precursor solution or suspension, one may choose to oxidize the graphite to some extent for a shorter period of time (e.g., 30 minutes-4 hours) to obtain graphite intercalation compound (GIC). The GIC particles are then exposed to a thermal shock, preferably in a temperature range of 600-1,100° C.

for typically 15 to 60 seconds to obtain exfoliated graphite or graphite worms, which are optionally (but preferably) subjected to mechanical shearing (e.g. using a mechanical shearing machine or an ultrasonicator) to break up the graphite flakes that constitute a graphite worm. Either the already separated graphene sheets (after mechanical shearing) or the un-broken graphite worms or individual graphite flakes are then re-dispersed in water, acid, or organic solvent and ultrasonicated to obtain a graphene dispersion.

The pristine graphene material is preferably produced by one of the following three processes: (A) Intercalating the graphitic material with a non-oxidizing agent, followed by a thermal or chemical exfoliation treatment in a non-oxidizing environment; (B) Subjecting the graphitic material to a supercritical fluid environment for inter-graphene layer penetration and exfoliation; or (C) Dispersing the graphitic material in a powder form to an aqueous solution containing a surfactant or dispersing agent to obtain a suspension and subjecting the suspension to direct ultrasonication to obtain a graphene dispersion.

In Procedure (A), a particularly preferred step comprises (i) intercalating the graphitic material with a non-oxidizing agent, selected from an alkali metal (e.g., potassium, sodium, lithium, or cesium), alkaline earth metal, or an alloy, mixture, or eutectic of an alkali or alkaline metal; and (ii) a chemical exfoliation treatment (e.g., by immersing potassium-intercalated graphite in ethanol solution).

In Procedure (B), a preferred step comprises immersing the graphitic material to a supercritical fluid, such as carbon dioxide (e.g., at temperature T>31° C. and pressure P>7.4 MPa) and water (e.g., at T>374° C. and P>22.1 MPa), for a period of time sufficient for inter-graphene layer penetration (tentative intercalation). This step is then followed by a sudden de-pressurization to exfoliate individual graphene layers. Other suitable supercritical fluids include methane, ethane, ethylene, hydrogen peroxide, ozone, water oxidation (water containing a high concentration of dissolved oxygen), or a mixture thereof.

In Procedure (C), a preferred step comprises (a) dispersing particles of a graphitic material in a liquid medium containing therein a surfactant or dispersing agent to obtain a suspension or slurry; and (b) exposing the suspension or slurry to ultrasonic waves (a process commonly referred to as ultrasonication) at an energy level for a sufficient length of time to produce a graphene dispersion of separated graphene sheets (non-oxidized NGPs) dispersed in a liquid medium (e.g. water, alcohol, or organic solvent).

NGPs can be produced with an oxygen content no greater than 25% by weight, preferably below 20% by weight, further preferably below 5%. Typically, the oxygen content is between 5% and 20% by weight. The oxygen content can be determined using chemical elemental analysis and/or X-ray photoelectron spectroscopy (XPS).

The laminar graphite materials used in the prior art processes for the production of the GIC, graphite oxide, and subsequently made exfoliated graphite, flexible graphite sheets, and graphene platelets were, in most cases, natural graphite. However, the present disclosure is not limited to natural graphite. The starting material may be selected from the group consisting of natural graphite, artificial graphite (e.g., highly oriented pyrolytic graphite, HOPG), graphite oxide, graphite fluoride, graphite fiber, carbon fiber, carbon nano-fiber, carbon nano-tube, mesophase carbon micro-bead (MCMB) or carbonaceous micro-sphere (CMS), soft carbon, hard carbon, and combinations thereof. All of these materials contain graphite crystallites that are composed of layers of graphene planes stacked or bonded together via van der Waals forces. In natural graphite, multiple stacks of graphene planes, with the graphene plane orientation varying from stack to stack, are clustered together. In carbon fibers, the graphene planes are usually oriented along a preferred direction. Generally speaking, soft carbons are carbonaceous materials obtained from carbonization of liquid-state, aromatic molecules. Their aromatic ring or graphene structures are more or less parallel to one another, enabling further graphitization. Hard carbons are carbonaceous materials obtained from aromatic solid materials (e.g., polymers, such as phenolic resin and polyfurfuryl alcohol). Their graphene structures are relatively randomly oriented and, hence, further graphitization is difficult to achieve even at a temperature higher than 2,500° C. But, graphene sheets do exist in these carbons.

Fluorinated graphene or graphene fluoride is herein used as an example of the halogenated graphene material group. There are two different approaches that have been followed to produce fluorinated graphene: (1) fluorination of pre-synthesized graphene: This approach entails treating graphene prepared by mechanical exfoliation or by CVD growth with fluorinating agent such as $XeF_2$, or F-based plasmas; (2) Exfoliation of multilayered graphite fluorides: Both mechanical exfoliation and liquid phase exfoliation of graphite fluoride can be readily accomplished [F. Karlicky, et al. "*Halogenated Graphenes: Rapidly Growing Family of Graphene Derivatives*" ACS Nano, 2013, 7 (8), pp 6434-6464].

Interaction of $F_2$ with graphite at high temperature leads to covalent graphite fluorides $(CF)_n$ or $(C_2F)_n$, while at low temperatures graphite intercalation compounds (GIC) $C_xF$ ($2 \leq x \leq 24$) form. In $(CF)_n$ carbon atoms are sp3-hybridized and thus the fluorocarbon layers are corrugated consisting of trans-linked cyclohexane chairs. In $(C_2F)_n$ only half of the C atoms are fluorinated and every pair of the adjacent carbon sheets are linked together by covalent C—C bonds. Systematic studies on the fluorination reaction showed that the resulting F/C ratio is largely dependent on the fluorination temperature, the partial pressure of the fluorine in the fluorinating gas, and physical characteristics of the graphite precursor, including the degree of graphitization, particle size, and specific surface area. In addition to fluorine ($F_2$), other fluorinating agents may be used, although most of the available literature involves fluorination with $F_2$ gas, sometimes in presence of fluorides.

For exfoliating a layered precursor material to the state of individual single graphene layers or few-layers, it is necessary to overcome the attractive forces between adjacent layers and to further stabilize the layers. This may be achieved by either covalent modification of the graphene surface by functional groups or by non-covalent modification using specific solvents, surfactants, polymers, or donor-acceptor aromatic molecules. The process of liquid phase exfoliation includes ultra-sonic treatment of a graphite fluoride in a liquid medium to produce graphene fluoride sheets dispersed in the liquid medium. The resulting dispersion can be directly used in the graphene deposition of polymer component surfaces.

The nitrogenation of graphene can be conducted by exposing a graphene material, such as graphene oxide, to ammonia at high temperatures (200-400° C.). Nitrogenated graphene could also be formed at lower temperatures by a hydrothermal method; e.g. by sealing GO and ammonia in an autoclave and then increased the temperature to 150-250° C. Other methods to synthesize nitrogen doped graphene include nitrogen plasma treatment on graphene, arc-discharge between graphite electrodes in the presence of ammonia, ammonolysis of graphene oxide under CVD conditions, and hydrothermal treatment of graphene oxide and urea at different temperatures.

For the purpose of defining the claims of the instant application, NGPs or graphene materials include discrete sheets/platelets of single-layer and multi-layer (typically less than 10 layers, the few-layer graphene) pristine graphene, graphene oxide, reduced graphene oxide (RGO), graphene fluoride, graphene chloride, graphene bromide, graphene iodide, hydrogenated graphene, nitrogenated graphene, chemically functionalized graphene, doped graphene (e.g. doped by B or N). Pristine graphene has essentially 0% oxygen. RGO typically has an oxygen content of 0.001%-5% by weight. Graphene oxide (including RGO) can have 0.001%-50% by weight of oxygen. Other than pristine graphene, all the graphene materials have 0.001%-50% by weight of non-carbon elements (e.g. O, H, N, B, F, Cl, Br, I, etc.). These materials are herein referred to as non-pristine graphene materials. The presently invented graphene can contain pristine or non-pristine graphene and the invented method allows for this flexibility. These graphene sheets all can be chemically functionalized.

Graphene sheets have a significant proportion of edges that correspond to the edge planes of graphite crystals. The carbon atoms at the edge planes are reactive and must contain some heteroatom or group to satisfy carbon valency. Further, there are many types of functional groups (e.g. hydroxyl and carboxylic) that are naturally present at the edge or surface of graphene sheets produced through chemical or electrochemical methods. Many chemical function groups (e.g. —NH$_2$, etc.) can be readily imparted to graphene edges and/or surfaces using methods that are well-known in the art.

The functionalized NGPs of the instant disclosure can be directly prepared by sulfonation, electrophilic addition to deoxygenated graphene platelet surfaces, or metallization. The graphene platelets can be processed prior to being contacted with a functionalizing agent. Such processing may include dispersing the graphene platelets in a solvent. In some instances, the platelets or may then be filtered and dried prior to contact. One particularly useful type of functional group is the carboxylic acid moieties, which naturally exist on the surfaces of NGPs if they are prepared from the acid intercalation route discussed earlier. If carboxylic acid functionalization is needed, the NGPs may be subjected to chlorate, nitric acid, or ammonium persulfate oxidation.

Carboxylic acid functionalized graphene sheets or platelets are particularly useful because they can serve as the starting point for preparing other types of functionalized NGPs. For example, alcohols or amides can be easily linked to the acid to give stable esters or amides. If the alcohol or amine is part of a di- or poly-functional molecule, then linkage through the O- or NH-leaves the other functionalities as pendant groups. These reactions can be carried out using any of the methods developed for esterifying or aminating carboxylic acids with alcohols or amines as known in the art. Examples of these methods can be found in G. W. Anderson, et al., J. Amer. Chem. Soc. 86, 1839 (1964), which is hereby incorporated by reference in its entirety. Amino groups can be introduced directly onto graphitic platelets by treating the platelets with nitric acid and sulfuric acid to obtain nitrated platelets, then chemically reducing the nitrated form with a reducing agent, such as sodium dithionite, to obtain amino-functionalized platelets.

The chemically functionalized graphene sheets are preferably those exhibiting a negative Zeta potential in a given dispersion, typically in the range from −55 mV to −0.1 mV.

These functionalized graphene sheets typically have a functional group that is attached to these sheets for imparting negative Zeta potential thereto. Zeta potential is the potential difference between the dispersion medium and the stationary layer of fluid attached to the dispersed particles (e.g. graphene sheets) dispersed in this dispersion medium (e.g. water, organic solvent, electrolyte etc.). Several commercially available instruments (e.g. Zetasizer Nano from Malvern Panalytical and SZ-100 from Horiba Scientific) can be used to measure the Zeta potential of different types of graphene sheets in different dispersion mediums.

It may be noted that a given type of graphene (e.g. graphene oxide or reduced graphene oxide) can exhibit a positive or negative Zeta potential and its value can vary, depending upon the chemical functional groups attached to graphene sheets and the dispersion medium used. Unless otherwise specified, the Zeta potential values provided are for the graphene sheets dispersed in an aqueous solution having a pH vale of 5.0-9.0 (mostly 7.0).

In some embodiments, the chemically functionalized graphene sheets contain a chemical functional group selected from alkyl or aryl silane, alkyl or aralkyl group, hydroxyl group, carboxyl group, amine group, sulfonate group (—SO$_3$H), aldehydic group, quinoidal, fluorocarbon, or a combination thereof. Alternatively, the functional group contains a derivative of an azide compound selected from the group consisting of 2-Azidoethanol, 3-Azidopropan-1-amine, 4-(2-Azidoethoxy)-4-oxobutanoic acid, 2-Azido-ethyl-2-bromo-2-methylpropanoate, chlorocarbonate, azidocarbonate, dichlorocarbene, carbene, aryne, nitrene, (R—)-oxycarbonyl nitrenes, where R=any one of the following groups,

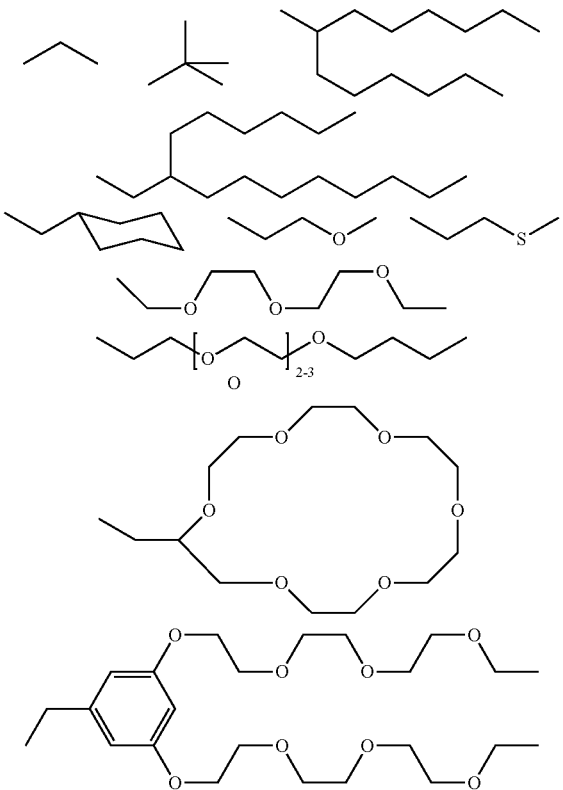

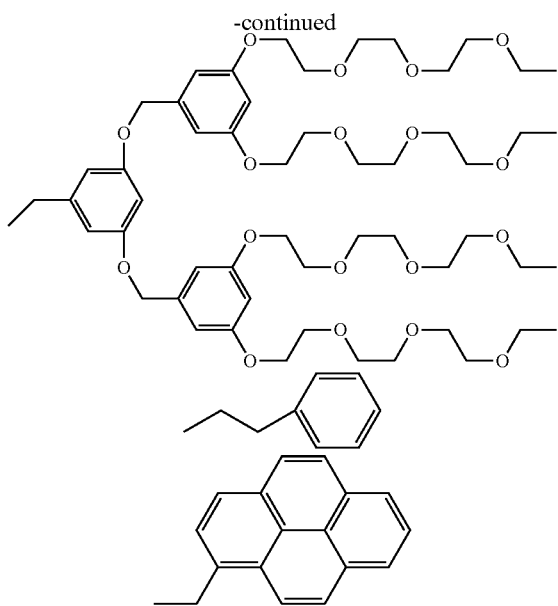

and combinations thereof.

In certain embodiments, the functional group is selected from the group consisting of hydroxyl, peroxide, ether, keto, and aldehyde. In certain embodiments, the functionalizing agent contains a functional group selected from the group consisting of $SO_3H$, COOH, $NH_2$, OH, R'CHOH, CHO, CN, COCl, halide, COSH, SH, COOR', SW, $SiR'_3$, $Si(-OR'-)_yR'_{3-y}$, $Si(-O-SiR'_2-)OR'$, R'', Li, $AlR'_2$, Hg—X, $TlZ_2$ and Mg—X; wherein y is an integer equal to or less than 3, R' is hydrogen, alkyl, aryl, cycloalkyl, or aralkyl, cycloaryl, or poly(alkylether), R'' is fluoroalkyl, fluoroaryl, fluorocycloalkyl, fluoroaralkyl or cycloaryl, X is halide, and Z is carboxylate or trifluoroacetate, and combinations thereof.

The functional group may be selected from the group consisting of amidoamines, polyamides, aliphatic amines, modified aliphatic amines, cycloaliphatic amines, aromatic amines, anhydrides, ketimines, diethylenetriamine (DETA), triethylene-tetramine (TETA), tetraethylene-pentamine (TEPA), polyethylene polyamine, polyamine epoxy adduct, phenolic hardener, non-brominated curing agent, non-amine curatives, and combinations thereof.

In some embodiments, the functional group may be selected from OY, NHY, O=C—OY, P=C—NR'Y, O=C—SY, O=C—Y, —CR'1-OY, N'Y or C'Y, and Y is a functional group of a protein, a peptide, an amino acid, an enzyme, an antibody, a nucleotide, an oligonucleotide, an antigen, or an enzyme substrate, enzyme inhibitor or the transition state analog of an enzyme substrate or is selected from R'—OH, R'—$NR'_2$, R'SH, R'CHO, R'CN, R'X, R'N$^+$ $(R')_3X^-$, $R'SiR'_3$, $R'Si(-OR'-)_yR'_{3-y}$, $R'Si(-O-SiR'_2-)$OR', R'—R'', R'—N—CO, $(C_2H_4O-)_wH$, $(-C_3H_6O-)_wH$, $(-C_2H_4O)_w$—R', $(C_3H_6O)_w$—R', R', and w is an integer greater than one and less than 200.

The graphene film may be produced by a process as schematically illustrated in FIG. 2(A). The graphene film typically comprises an aggregate (or cluster) of oriented/aligned graphene sheets that are substantially parallel to one another.

Figure 3A:
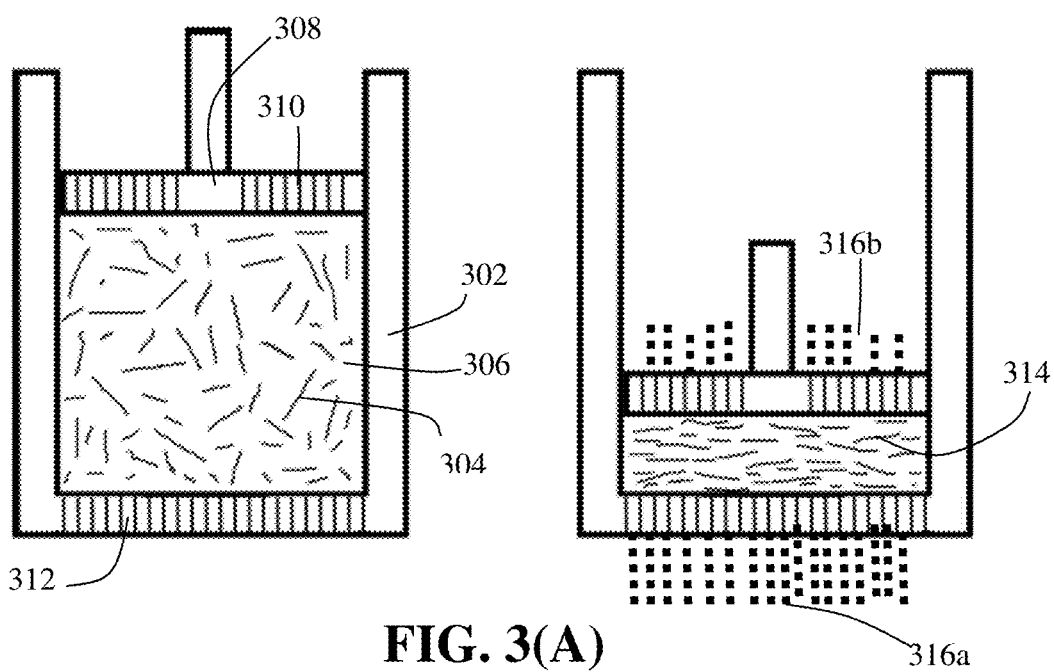
FIG. 3(A) Schematic drawing to illustrate an example of a compressing and consolidating operation (using a mold cavity cell equipped with a piston or ram) for forming a layer of highly oriented graphene sheets, which are aligned parallel to the bottom plane or perpendicular to the layer thickness direction.
Figure 3B:
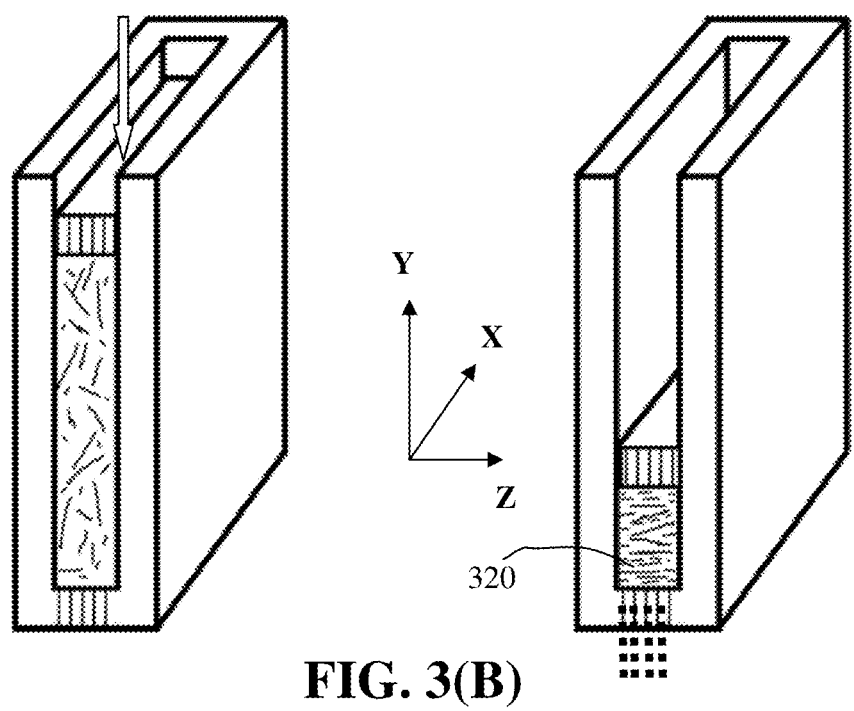
FIG. 3(B) Schematic drawing to illustrate another example of a compressing and consolidating operation (using a mold cavity cell equipped with a piston or ram) for forming a layer of highly oriented graphene sheets, which are aligned perpendicular to the side plane (X-Y plane) or parallel to the layer thickness direction (Z direction).
Figure 3C:
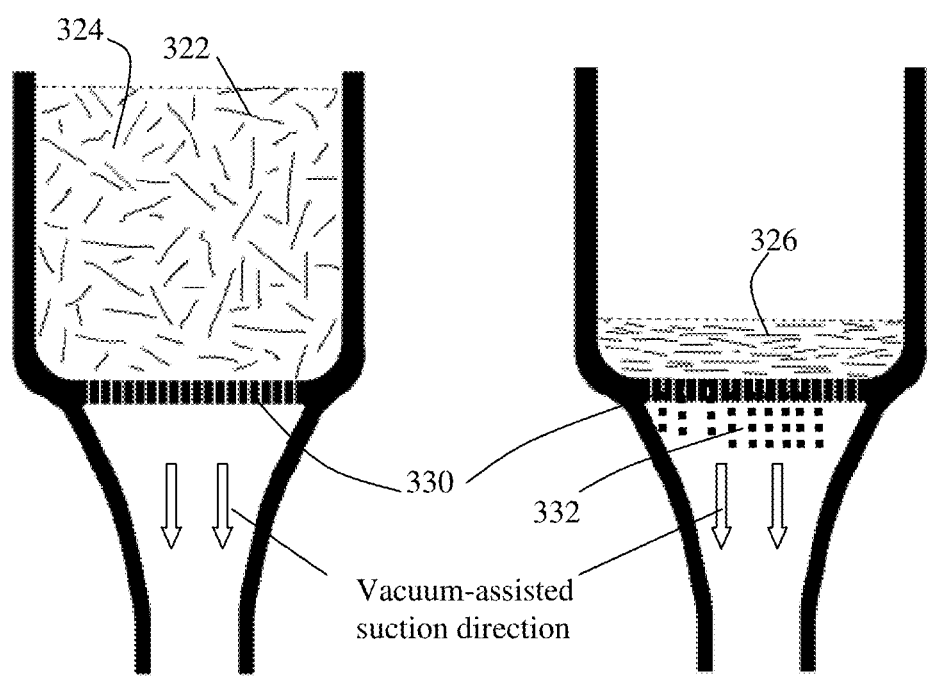
FIG. 3(C) Schematic drawing to illustrate yet another example of a compressing and consolidating operation (using a mold cavity cell with a vacuum-assisted suction provision) for forming a layer of highly oriented graphene sheets, which are aligned parallel to the bottom plane or perpendicular to the layer thickness direction.
Figure 3D:
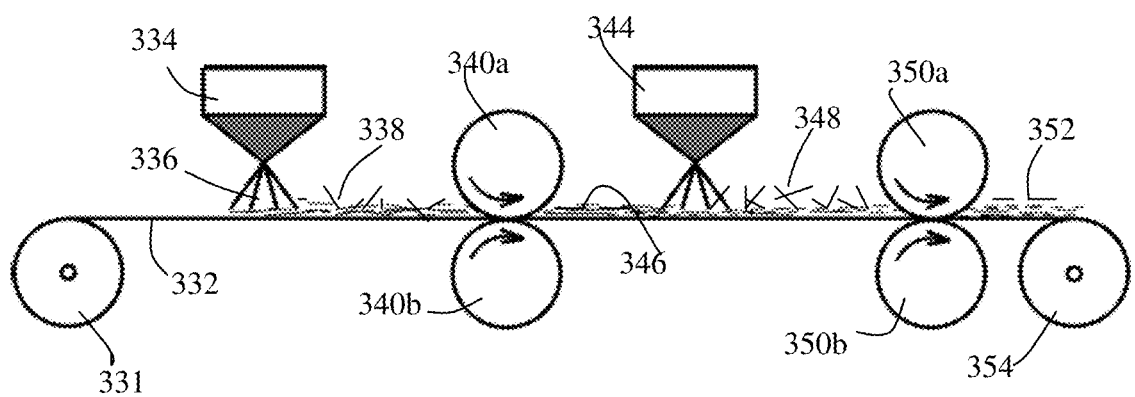
FIG. 3(D) A roll-to-roll process for producing a layer of graphene sheets that are well-aligned on the supporting substrate plane.

In some embodiments, the procedure of forming a layer of an aggregate or cluster of multiple oriented/aligned graphene sheets comprises a procedure selected from air-assisted or liquid-assisted spraying of multiple graphene sheets (e.g. as illustrated in FIG. 3(D)).

In some embodiments, the procedure of providing a layer of an aggregate or cluster of multiple graphene sheets comprises a procedure selected from coating, casting, air-assisted clustering, liquid assisted clustering, spraying, printing, or a combination thereof. The coating procedure may be selected from vapor deposition, chemical coating, electrochemical coating or plating, spray-coating, painting, brushing, roll-to-roll coating, physical coating, or a combination thereof.

In certain embodiments, the procedure of forming a layer of an aggregate or cluster of multiple oriented/aligned graphene sheets comprises (i) forming a graphene dispersion (also referred to as suspension or slurry) containing multiple graphene sheets dispersed in a liquid medium; (ii) dispensing and depositing such a dispersion to form a wet layer of the graphene sheets on a solid substrate surface using a procedure selected from coating, casting, spraying, printing, forced assembling and orienting procedure, or a combination thereof and removing the liquid medium to form a dry layer; and (iii) optionally heat treating the dry layer of graphene sheets at a temperature from 50° C. to 3,200° C.

Preferably, the coating procedure includes a roll-to-roll coating process selected from air knife coating, Anilox coating, Flexo coating, gap coating or knife-over-roll coating, gravure coating, hot melt coating, immersion dip coating, kiss coating, metering rod or Meyer bar coating, roller coating, silk screen coating or rotary screen coating, slot-die coating, comma coating, extrusion coating, inkjet printing, or a combination thereof. A pair of counter-rotating rollers may be used to roll-press the aggregate or cluster of graphene sheets, helping to align/orient the graphene sheets to become parallel to each other. Coating processes are well-known in the art.

In some preferred embodiments, the process further comprises a procedure for heat-treating the layer of an aggregate or cluster of multiple graphene sheets at a temperature or multiple different temperatures selected from 50° C. to 3,200° C. For instance, the layer of aggregate of oriented graphene sheets (e.g. graphene oxide sheets or graphene fluoride sheets) may be heat-treated first at a temperature selected from 300° C. to 1,500° C. for 1-3 hours and then at a temperature selected from 2,500° C. to 3,200° C. for 0.5-2 hours.

After the heat treatment procedure, the resulting aggregate of graphene sheets may be subjected to further compression (e.g. roll-pressing) to align/orient the graphene sheets to become parallel to each other.

Alternatively, alignment of graphene sheets can be achieved through a forced assembly approach that is schematically illustrated in FIG. 3(A), FIG. 3(B), FIG. 3(C), and FIG. 3(D).

In some desired embodiments, the forced assembly procedure includes introducing a dispersion of graphene sheets (also referred to as a graphene dispersion), having an initial volume $V_1$, in a mold cavity cell and driving a piston into the mold cavity cell to reduce the graphene dispersion volume to a smaller value $V_2$, allowing most of the remaining dispersion liquid to flow out of the cavity cell (e.g. through holes of the mold cavity cell or of the piston) and aligning the multiple graphene sheets along a direction at an angle from 0° to 90° relative to a movement direction of said piston.

FIG. 3(A) provides a schematic drawing to illustrate an example of a compressing and consolidating operation (using a mold cavity cell 302 equipped with a piston or ram 308) for forming a layer of highly compacted and oriented graphene sheets 314. Contained in the chamber (mold cavity cell 302) is a dispersion (e.g. suspension or slurry that is composed of graphene sheets 304 randomly dispersed in a liquid 306, optional containing an adhesive precursor). As the piston 308 is driven downward, the volume of the dispersion is decreased by forcing liquid to flow through minute channels 312 on a mold wall or through small channels 310 of the piston. These small channels can be present in any or all walls of the mold cavity and the channel sizes can be designed to permit permeation of the liquid, but not the solid graphene sheets (typically 0.05-100 µm in length or width). The liquid is shown as 316a and 316b on the right diagram of FIG. 3(A). As a result of this compressing and consolidating operation, graphene sheets 314 are aligned parallel to the bottom plane or perpendicular to the layer thickness direction.

Shown in FIG. 3(B) is a schematic drawing to illustrate another example of a compressing and consolidating operation (using a mold cavity cell equipped with a piston or ram) for forming a layer of highly oriented graphene sheets 320. The piston is driven downward along the Y-direction. The graphene sheets are aligned on the X-Z plane and perpendicular to X-Y plane (along the Z- or thickness direction). This layer of oriented graphene sheets can be attached to a supporting substrate that is basically represented by the X-Y plane. In the resulting electrode, graphene sheets are aligned perpendicular to the substrate.

FIG. 3(C) provides a schematic drawing to illustrate yet another example of a compressing and consolidating operation (using a mold cavity cell with a vacuum-assisted suction provision) for forming a layer of highly oriented graphene sheets 326. The process begins with dispersing isolated graphene sheets 322 and an optional adhesive in a liquid 324 to form a dispersion. This is followed by generating a negative pressure via a vacuum system that sucks liquid 332 through channels 330. This compressing and consolidating operation acts to reduce the dispersion volume and align all the isolated graphene sheets on the bottom plane of a mold cavity cell. Compacted graphene sheets are aligned parallel to the bottom plane or perpendicular to the layer thickness direction. Preferably, the resulting layer of graphene sheet structure is further compressed to achieve an even high tap density.

Thus, in some desired embodiments, the forced assembly procedure includes introducing a dispersion of graphene sheets in a mold cavity cell having an initial volume $V_1$, and applying a suction pressure through a porous wall of the mold cavity to reduce the dispersion volume to a smaller value $V_2$, allowing liquid to flow out of the cavity cell through the porous wall and aligning the multiple graphene sheets along a direction at an angle from approximately 0° to approximately 90° relative to a suction pressure direction; this angle depending upon the inclination of the bottom plane with respect to the suction direction.

FIG. 3(D) shows a roll-to-roll process for producing a thick layer of heat spreader containing aligned graphene sheets and an optional adhesive. This process begins by feeding a continuous solid substrate 332 (e.g. PET film or stainless steel sheet) from a feeder roller 331. A dispenser 334 is operated to dispense a dispersion 336 containing isolated graphene sheets and an optional elastomer/rubber resin precursor onto the substrate surface to form a layer of deposited dispersion 338, which feeds through the gap between two compressing rollers, 340a and 340b, to form a layer of highly oriented graphene sheets. The graphene sheets are well-aligned on the supporting substrate plane. If so desired, a second dispenser 344 is then operated to dispense another layer of dispersion 348 on the surface of the previously consolidated dispersion layer. The two-layer structure is then driven to pass through the gap between two roll-pressing rollers 350a and 350b to form a thicker layer 352 of graphene sheets, which is taken up by a winding roller 354.

Thus, in some preferred embodiments, the forced assembly procedure includes introducing a first layer of the graphene sheet dispersion (with or without an adhesive) onto a surface of a supporting conveyor and driving the layer of graphene sheets suspension supported on the conveyor through at least a pair of pressing rollers to reduce the thickness of the graphene sheets dispersion layer and align the multiple graphene sheets along a direction parallel to the conveyor surface for forming a layer of graphene sheets.

The above paragraphs about FIG. 3(A)-FIG. 3(D) are but four of the many examples of possible apparatus or processes that can be used to produce thermal film structures that contain highly oriented and closely packed graphene sheets.

The produced graphitic films and/or graphene films can then be laminated together by placing a thin layer of conducting polymer network adhesive between two films. Lamination processes are well-known in the art.

Figure 8:
FIG. 8 Schematic illustrating an embodiment of a multi-film laminated structure.

FIG. 8 demonstrates an embodiment of the laminated structure. Sections 110 are the graphitic film or graphene film layers, while sections 115 are the conducting polymer network adhesive layers.

In some highly useful embodiments, the heat spreader film is in a thin film form having a thickness from 10 nm to 1,000 µm and the graphene sheets (in a graphene film) or the graphitic crystals (in a graphitic film) are substantially aligned parallel to a thin film plane. In some preferred embodiments, the heat spreader or laminated graphitic layer is in a thin film form having a thickness from 100 nm to 500 µm and graphene sheets and/or graphitic crystals being aligned parallel to a thin film plane.

Typically, the disclosed heat spreader film or laminated graphitic layer has a tensile strength no less than 100 MPa, a tensile modulus no less than 25 GPa, a thermal conductivity no less than 500 W/mK, and/or an electrical conductivity no less than 5,000 S/cm, all measured along a thin film plane direction. Typically and preferably, the film has a tensile strength no less than 300 MPa, a tensile modulus no less than 50 GPa, a thermal conductivity no less than 800 W/mK, and/or an electrical conductivity no less than 8,000 S/cm, all measured along a thin film plane direction. In many cases, the film has a tensile strength no less than 400 MPa, a tensile modulus no less than 150 GPa, a thermal conductivity no less than 1,200 W/mK, and/or an electrical conductivity no less than 12,000 S/cm, all measured along a thin film plane direction. Some of the disclosed heat spreader films exhibit a tensile strength no less than 500 MPa, a tensile modulus no less than 250 GPa, a thermal conductivity no less than 1,500 W/mK, and/or an electrical conductivity no less than 20,000 S/cm, all measured along a thin film plane direction. Typically, the invented film exhibits a Vickers hardness value from 70 to 400 HV.

The following examples are used to illustrate some specific details about the best modes of practicing the instant disclosure and should not be construed as limiting the scope of the disclosure. The tensile properties, thermal conductivity, and electrical conductivity of the films were measured by following well-known standard procedures.

Example 1: Graphene Oxide from Sulfuric Acid Intercalation and Exfoliation of MCMBs and Production of GO-Based Graphene Films MCMB (meso-carbon microbeads) were supplied by China Steel Chemical Co. This material has a density of about 2.24 g/cm$^3$ with a median particle size of about 16 μm. MCMBs (10 grams) were intercalated with an acid solution (sulfuric acid, nitric acid, and potassium permanganate at a ratio of 4:1:0.05) for 48 hours. Upon completion of the reaction, the mixture was poured into deionized water and filtered. The intercalated MCMBs were repeatedly washed in a 5% solution of HCl to remove most of the sulfate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 800° C.-1,100° C. for 30-90 seconds to obtain reduced graphene oxide (RGO) sheets. A quantity of graphene sheets was mixed with water and ultrasonicated at 60-W power for 10 minutes to obtain a graphene dispersion.

A small amount was sampled out, dried, and investigated with TEM, which indicated that most of the NGPs were between 1 and 10 layers. The oxygen content of the graphene powders (GO or RGO) produced was from 0.1% to approximately 25%, depending upon the exfoliation temperature and time.

Several graphene dispersions were subjected to a slot-die coating procedure to deposit a wet layer of GO sheets, having a thickness of 10-100 μm, on PET films. Upon drying, the resulting thin films of reduced graphene oxide (RGO) were subjected to a heat treatment to produce graphene films. The heat treatment conditions were as follows: treating at 300° C. for 2 hours, ramping up temperatures at a rate of 250 degrees/hour, and then heat-treating at 2,850° C. for 1 hour. The resulting graphene films were then roll-pressed until the physical density reached a value from approximately 1.7 to 2.2 g/cm$^3$. Five graphene films were then laminated with an ultra-thin coating of polyaniline network polymer adhesive between two adjacent graphene films to make a laminated graphitic layer of approximately 100 μm thick. A total of 4 adhesive coating films, each approximately 30 nm thick, were deposited, between consecutive films (between 1 and 2, between 2 and 3, between 3 and 4, and between 4 and 5). A control sample of a similar laminate was also prepared, but the adhesive was epoxy resin.

Figure 4A:
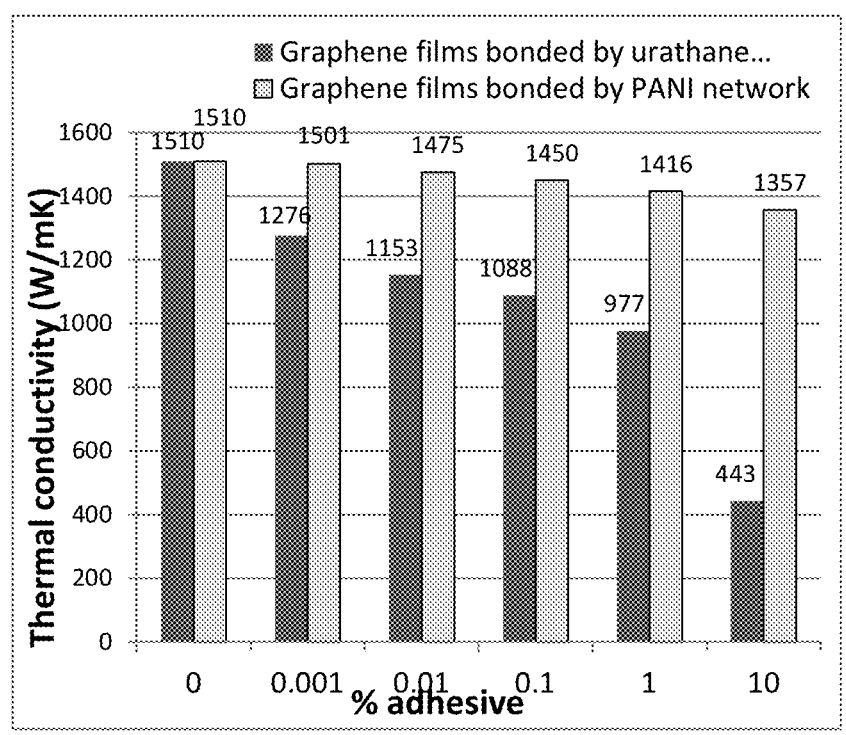
FIG. 4(A) Thermal conductivity values over weight percentage of adhesive for two series of heat spreader films: one series containing conducting polyaniline network-based adhesive and the other series containing polyurethane-based adhesive.

FIG. 4(A) shows the thermal conductivity values plotted over a wide weight percentage range (0.001%-10%) of an adhesive for two series of heat spreader films: one series containing polyaniline network adhesive and the other series containing urethane-based adhesive. As one can see, an increase in the proportion of urethane adhesive (a non-conducting elastomer material) leads to a rapid degradation in the thermal conductivity of a laminated graphitic film. However, a relatively small reduction in thermal conductivity with increasing adhesive proportion is observed with the laminated graphitic layer having a conducting polymer network-based adhesive. This unexpected result is significant and has a great utility value considering the notion that this strategy enables us to achieve a high thermal conductivity yet also maintaining a high resistance to bending-induced thermal conductivity loss (FIG. 4(B)).

Figure 4B:
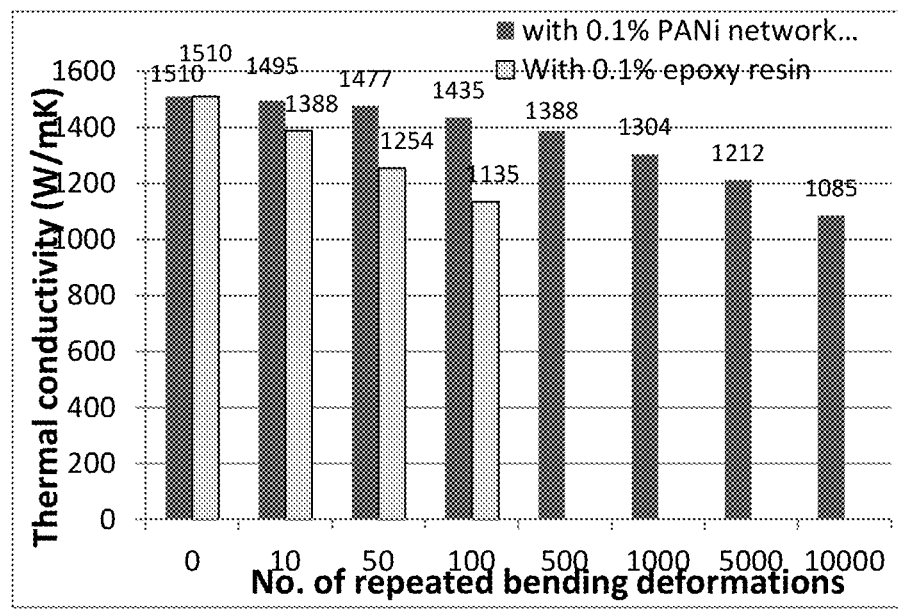
FIG. 4(B) Thermal conductivity plotted as a function of the number of repeated bending deformations for two series of laminated graphitic layers: one containing conducting network polymer-based adhesive between graphene films and the other containing epoxy-based adhesive.

Shown in FIG. 4(B) are the thermal conductivity values plotted as a function of the number of repeated bending deformations for two series of thermal films. The sample containing no elastomer exhibits a drop in thermal conductivity from 1510 W/mK to 1,135 W/mk after 100 bending deformations, each by 180 degrees. The sheet was broken after 125 cycles of bending. In contrast, a small amount of conducting polymer network (polyaniline or PANi) incorporated into the heat spreader films can withstand 10,000 times of repeated bending without breaking and still maintains a relatively high thermal conductivity.

Figure 4C:
FIG. 4(C) Schematic illustrating the repeated bending test.
Figure 4C:

Bending test is easy to perform, as illustrated in FIG. 4(C). One can take a desired number of identical thermal films and measure thermal conductivity of a specimen prepared by slitting a piece of the film across the bending area, after a desired number of repeated bending deformations, and then measure the thermal conductivity of this piece using the well-known Laser Flash or other method.

Example 2: Oxidation and Exfoliation of Natural Graphite to Produce Graphene Oxide (GO) Sheets and GO-Based Graphene Films Graphite oxide was prepared by oxidation of graphite flakes with sulfuric acid, sodium nitrate, and potassium permanganate at a ratio of 4:1:0.05 at 30° C. for 48 hours, according to the method of Hummers [U.S. Pat. No. 2,798, 878, Jul. 9, 1957]. Upon completion of the reaction, the mixture was poured into deionized water and filtered. The sample was then washed with 5% HCl solution to remove most of the sulfate ions and residual salt and then repeatedly rinsed with deionized water until the pH of the filtrate was approximately 4. The intent was to remove all sulfuric and nitric acid residue out of graphite interstices. The slurry was dried and stored in a vacuum oven at 60° C. for 24 hours.

The dried, intercalated (oxidized) compound was exfoliated by placing the sample in a quartz tube that was inserted into a horizontal tube furnace pre-set at 650° C. to obtain highly exfoliated graphite. The exfoliated graphite was dispersed in water along with a 1% surfactant at 45° C. in a flat-bottomed flask and the resulting suspension was subjected to ultrasonication for a period of 15 minutes to obtain dispersion of graphene oxide (GO) sheets.

The dispersion was then coated onto a PET film using a reverse-roll coating procedure to obtain GO films. Upon peeling from PET substrate, the GO films were then placed in a graphite mold and subjected to various heat treatments, having a final heat treatment temperature from 25° C. to 2,900° C. After heat treatments, the films were roll-pressed to reduce the porosity.

Figure 5:
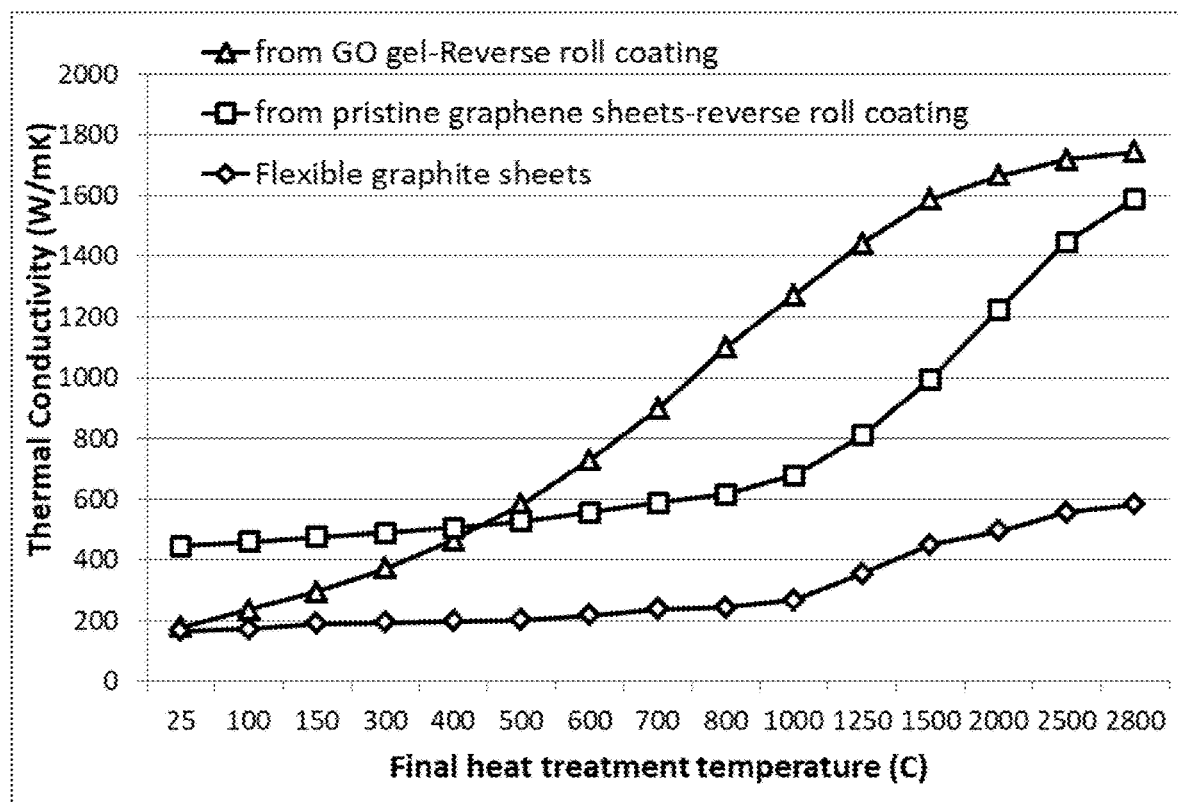
FIG. 5 Thermal conductivity values of graphene-based thermal films plotted as a function of the final heat treatment temperature.

The thermal conductivity values of graphene/rubber films, along with those of flexible graphite sheets, are plotted as a function of the final heat treatment temperatures in FIG. 5. This chart indicates the significance of final heat treatment temperatures on the thermal conductivity of various graphene films.

Example 3: Preparation of Pristine Graphene Sheets and Graphene Films

Pristine graphene sheets were produced by using the direct ultrasonication or liquid-phase exfoliation process. In a typical procedure, five grams of graphite flakes, ground to approximately 20 μm in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours. The resulting graphene sheets were pristine graphene that had never been oxidized and were oxygen-free and relatively defect-free. Thermal films were prepared from pristine graphene by following the procedure as described in Example 2. The thermal conductivity values of pristine graphene/rubber films are plotted as a function of the final heat treatment temperatures in FIG. 5.

Examples 4: Preparation of Graphene Fluoride (GF) and GF-Based Graphene Films

Several processes have been used by us to produce GF, but only one process is herein described as an example. In a typical procedure, highly exfoliated graphite (HEG) was prepared from intercalated compound $C_2F \cdot xClF_3$. HEG was further fluorinated by vapors of chlorine trifluoride to yield fluorinated highly exfoliated graphite (FHEG). A pre-cooled Teflon reactor was filled with 20-30 mL of liquid pre-cooled $ClF_3$, and then the reactor was closed and cooled to liquid nitrogen temperature. Subsequently, no more than 1 g of HEG was put in a container with holes for $ClF_3$ gas to access the reactor. After 7-10 days, a gray-beige product with approximate formula $C_2F$ was formed. GF sheets were then dispersed in halogenated solvents to form suspensions. The suspensions were then coated on PET film substrate surfaces using comma coating, dried, peeled off from the substrate, and heat treated at 500° C. for 3 hours and 2750° C. for 1 hour. After heat treatments, the films were then roll-pressed to increase the physical densities to 1.90-2.15 g/cm$^3$.

Example 5: Preparation of Nitrogenated Graphene and Graphene Films

Graphene oxide (GO), synthesized in Example 2, was finely ground with different proportions of urea and the pelletized mixture heated in a microwave reactor (900 W) for 30 s. The product was washed several times with deionized water and vacuum dried. In this method graphene oxide gets simultaneously reduced and doped with nitrogen. The products obtained with graphene/urea mass ratios of 1/0.5, 1/1 and 1/2 are designated as N-1, N-2 and N-3 respectively and the nitrogen contents of these samples were 14.7, 18.2 and 17.5 wt. % respectively as determined by elemental analysis. These nitrogenated graphene sheets remain dispersible in water. The resulting dispersion was subjected to the compressing/aligning procedure as depicted in FIG. 3(A) to form graphene thermal films.

Example 6: Functionalized Graphene-Based Thermal Films

Thermal films were prepared from several functionalized graphene-elastomer dispersions containing 5% by weight of functionalized graphene sheets (few-layer graphene) and 0.01% by weight of urethane oligomer (a mixture of di-isocyanate and polyol). Chemical functional groups involved in this study include an azide compound (2-Azidoethanol), alkyl silane, hydroxyl group, carboxyl group, amine group, sulfonate group (—$SO_3H$), and diethylenetriamine (DETA). These functionalized graphene sheets were supplied from Taiwan Graphene Co., Taipei, Taiwan. Upon casting of the dispersion, removal of the liquid medium (acetone), compressed with a heated press and cured at 150° C. for 45 minutes, one obtained thermal films wherein graphene sheets were well bonded to urethane based elastomer. The presently invented highly oriented graphene-elastomer composite films can deliver a thermal conductivity as high as 1,255 W/mK. These composite graphene films were used as constituent films in laminated graphitic layers.

Example 7: Preparation of Graphitic Films from Polybenzoxazole (PBO) Films, PBO/Graphene Films, and PBO/Expanded Graphite Flake Films Polybenzoxazole (PBO) films were prepared via casting and thermal conversion from its precursor, methoxy-containing polyaramide (MeO-PA). Specifically, monomers of 4, 4'-diamino-3,3'-dimethoxydiphenyl (DMOBPA), and isophthaloyl dichloride (IPC) were selected to synthesize PBO precursors, methoxy-containing polyaramide (MeO-PA) solution. This MeO-PA solution for casting was prepared by polycondensation of DMOBPA and IPC in DMAc solution in the presence of pyridine and LiCl at −5° C. for 2 hr, yielding a 20 wt % pale yellow transparent MeO-PA solution. The inherent viscosity of the resultant MeO-PA solution was 1.20 dL/g measured at a concentration of 0.50 g/dl at 25° C. This MeO-PA solution was diluted to a concentration of 15 wt % by DMAc for casting.

Figure 6:
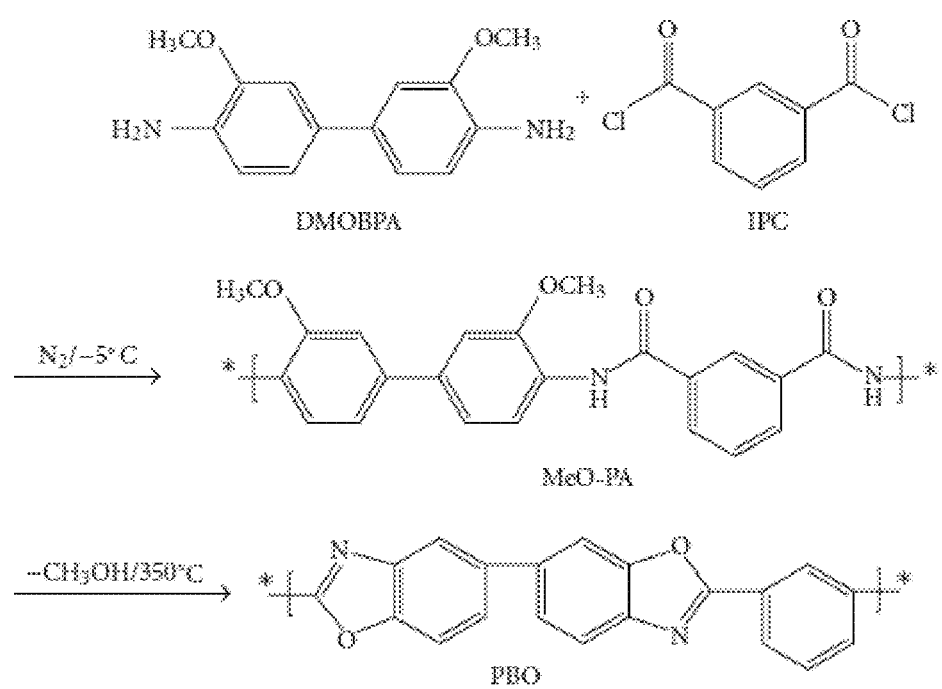
FIG. 6 Chemical reactions associated with production of PBO.

The as-synthesized MeO-PA was cast onto a glass surface to form thin films (35-120 μm) under a shearing condition. The cast film was dried in a vacuum oven at 100° C. for 4 hours to remove the residual solvent. Then, the resulting film with thickness of approximately 28-100 μm was treated at 200° C.-350° C. under $N_2$ atmosphere in three steps and annealed for about 2 hours at each step. This heat treatment serves to thermally convert MeO-PA into PBO films. The chemical reactions involved may be illustrated in FIG. 6. For comparison, both graphene-reinforced PBO (NGP-PBO) and expanded graphite flake-PBO films were made under similar conditions. The NGP or EP flake proportions, prepared in Example 1, were varied from 0.01% to 50% by weight.

All the films prepared were pressed between two plates of alumina while being heat-treated (carbonized) under a 3-sccm argon gas flow in three steps: from room temperature to 600° C. in 1 h, from 600 to 1,000° C. in 1.5 h, and maintained at 1,000° C. for 1 h. The carbonized films were then roll-pressed in a pair of rollers to reduce the thickness by approximately 40%. The roll-pressed films were then subjected to graphitization treatments at 2,500° C. for 2 hours to produce porous graphitic films. Subsequently, the porous graphitic films were compressed with a heated press.

Figure 7:
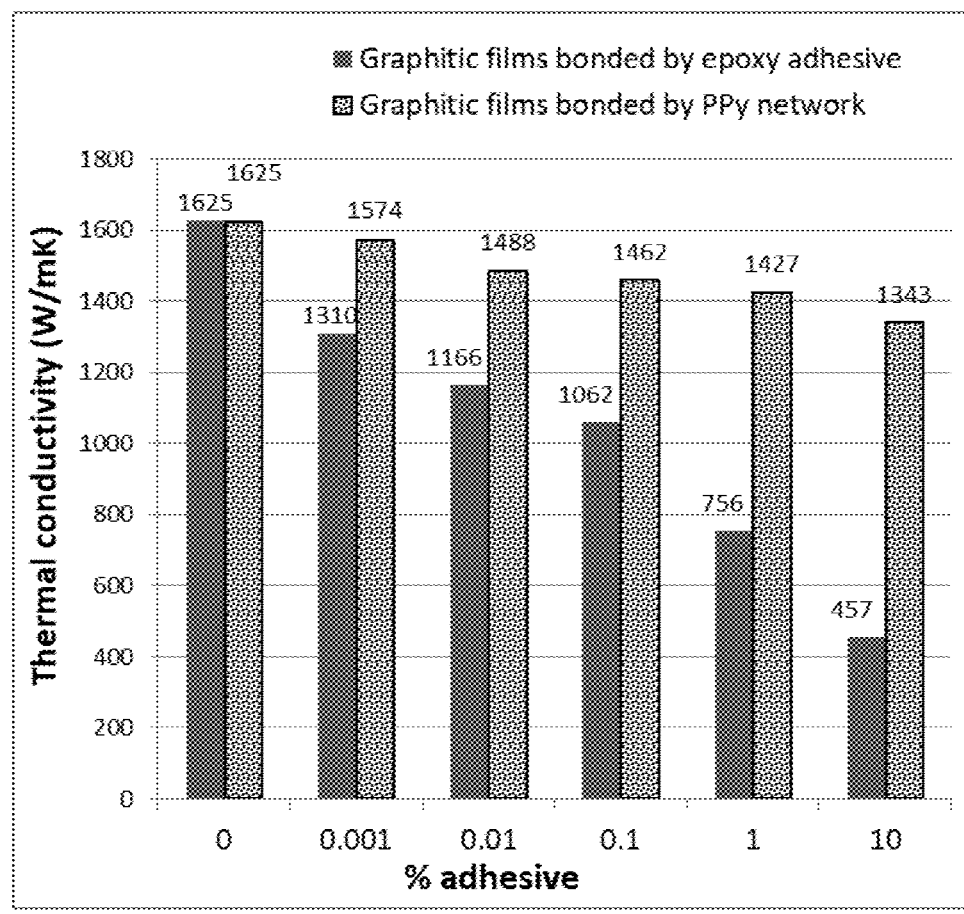
FIG. 7 Thermal conductivities of laminated graphitic layers plotted as a function of the adhesive proportion; conducting network polymer adhesive vs. epoxy adhesive.

FIG. 7 shows the thermal conductivity values plotted over a wide weight percentage range (0.001%-10%) of an adhesive for two series of heat spreader films: one series containing polypyrrole network adhesive and the other series containing epoxy-based adhesive. As one can see, an increase in the proportion of urethane adhesive (a non-conducting elastomer material) leads to a rapid degradation in the thermal conductivity of a laminated graphitic film. However, a relatively small reduction in thermal conductivity with increasing adhesive proportion is observed with the laminated graphitic layer having a conducting polymer network-based adhesive. This unexpected result is significant and has a great utility value considering the notion that this strategy enables us to achieve a high thermal conductivity yet also maintaining a high resistance to bending-induced thermal conductivity loss.

Example 8: Preparation of Graphitic Films from Polyimide (PI) Films and Graphene-Reinforced PI Films The synthesis of conventional polyimide (PI) involved poly(amic acid) (PAA, Sigma Aldrich) formed from pyromellitic dianhydride (PMDA) and oxydianiline (ODA). Prior to use, both chemicals were dried in a vacuum oven at room temperature. Next, as an example, 4 g of the monomer ODA was dissolved into 21 g of DMF solution (99.8 wt %). This solution was stored at 5° C. before use. PMDA (4.4 g) was added, and the mixture was stirred for 30 min using a magnetic bar. Subsequently, the clear and viscous polymer solution was separated into four samples. Triethyl amine catalyst (TEA, Sigma Aldrich) with 0, 1, 3, and 5 wt % was then added into each sample to control the molecular weight. Stirring was maintained by a mechanical stirrer until the entire quantity of TEA was added. The as-synthesized PAA was kept at −5° C. to maintain properties essential for further processing.

Solvents utilized in the poly(amic acid) synthesis play a very important role. Common dipolar aprotic amide solvents utilized are DMF, DMAc, NMP and TMU. DMAc was utilized in the present study. The intermediate poly(amic acid) and graphene/PAA precursor composite were converted to the final polyimide by the thermal imidization route. Graphene sheets used were prepared in Examples 2 and 3. Films were first cast on a glass substrate and then allowed to proceed through a thermal cycle with temperatures ranging from 100° C. to 350° C. The procedure entails heating the poly(amic acid) mixture to 100° C. and holding for one hour, heating from 100° C. to 200° C. and holding for one hour, heating from 200° C. to 300° C. and holding for one hour and slow cooling to room temperature from 300° C.

All the thin films were then carbonized at 500° C. for 2 hours and then at 700° C. for 3 hours. The carbonized films were then subjected to further heat treatments (graphitization) at temperatures that were varied from 2,500 to 2,950° C. for 2 hours.

After heat treatments, the porous graphitic films were roll-pressed to obtain consolidated graphitic films.

Example 10: Preparation of Graphitic Films from Polybenzimidazole (PBI) Films and Graphene/PBI Films PBI is prepared by step-growth polymerization from 3,3',4,4'-tetraaminobiphenyl and diphenyl isophthalate (an ester of isophthalic acid and phenol). The PBI used in the present study was obtained from PBI Performance Products in a PBI solution form, which contains 0.7 dl/g PBI polymer dissolved in dimethylacetamide (DMAc). The PBI and NGP-PBI films were cast onto the surface of a glass substrate. The heat treatment, elastomer resin impregnation, and roll-pressing procedures were similar to those used in Example 9 for PBO.

Example 11: Graphitic Films from Various Pitch-Based Carbon Precursors

Additional graphitic films were prepared from several different types of precursor materials. Their electric and thermal conductivity values are listed in Table 1 below.

TABLE 1

Preparation conditions and properties of graphitic films from other precursor materials

| Sample No. | NGP or EP | Carbon Precursor | Graphitization temperature (° C.) | Elastomer/rubber | Electric conduc. (S/cm) | Thermal conduc. (W/mK) |
|---|---|---|---|---|---|---|
| 12-A | Pristine graphene, 25% | Petroleum pitch | 2,850 | Urea-urethane copolymer | 12,300 | 1485 |
| 12-B | None | Petroleum pitch | 2,850 | Urea-urethane copolymer | 11,850 | 1444 |
| 12-C | EP, 30% | Petroleum pitch | 2,850 | Urea-urethane copolymer | 11,976 | 1466 |
| 15-A | Reduced GO, 35% | Naphthalene | 2,800 | Polyurethane | 13,322 | 1555 |
| 16-A | Fluorinated graphene, 50% | Coal tar pitch | 2,750 | Polyisoprene | 12,022 | 1466 |
| 16-B | none | Coal tar pitch | 2,750 | SBR | 13,255 | 1550 |

The PI and graphene-reinforced PI films, pressed between two alumina plates, were heat-treated under a 3-sccm argon gas flow at 1,000° C. This occurred in three steps: from room temperature to 600° C. in 1 h, from 600 to 1,000° C. in 1.3 h, and 1,000° C. maintained for 1 h. The carbonized films were then graphitized at a temperature of 2,780° C. for 1 hour to obtain porous graphitic films. After heat treatments, the films were roll-pressed to increase the physical densities to 1.7-2.05 g/cm$^3$.

Example 9: Preparation of Graphitic Films Derived from Phenolic Resin Films, Expanded Graphite/Phenolic Resin Films, and Graphene/Phenolic Films Phenol formaldehyde resins (PF) are synthetic polymers obtained by the reaction of phenol or substituted phenol with formaldehyde. The PF resin, alone or with 25% by weight graphene fluoride sheets (prepared in Example 4) or expanded graphite (EP) flakes (prepared in Example 1), was made into 50-μm thick films and cured under identical curing conditions: a steady isothermal cure temperature at 100° C. for 2 hours and then increased from 100 to 170° C. and maintained at 170° C. to complete the curing reaction.

Example 12: Production of PEDOT:PS Conductive Network Adhesive

Poly(3,4-ethylenedioxythiophene):polystyrene sulfonate (PEDOT:PSS) is a polymer mixture of two ionomers. One component is made up of sodium polystyrene sulfonate, which is a sulfonated polystyrene. Part of the sulfonyl groups are deprotonated and carry a negative charge. The other component poly(3,4-ethylenedioxythiophene) or PEDOT is a conjugated polymer, polythiophene, which carries positive charges. Together the two charged polymers form a macromolecular salt. The PEDOT/PSS is soluble in water. The PEDOT/PSS-water solution was used as an adhesive.

Example 13: Preparation of Polypyrrole-Based Conductive Polymer Network Adhesive Polypyrrole networks (cross-linked PPy or PPy hydrogels) were prepared via a two-reactant, one-pot process. Pyrrole (>97% purity) was dissolved in a solvent of water/ethanol (1:1 by weight) to achieve the first reactant having a concentration of 0.209 mol/L.

Then, as the second reactant, aqueous solutions of ferric nitrate ($Fe(NO_3)_3 \cdot 9H_2O$) and ferric sulfate, respectively, were made at concentrations of 0.5 mol/L. Subsequently, polymerization of the network gels was initiated in an ice bath at 0° C., by mixing volumes of the two reactants at 1:1 molar ratios of pyrrole:ferric salt, to create a reacting mixture with a total of 4 mL. A desired amount of graphene sheets was dispersed in this reacting mixture. After rigorously stirring for 1 minutes, the slurry mass was allowed to be deposited between graphitic films and to undergo polymerization and cross-linking. A pyrrole:ferric salt molar ratio of 1:1, which is stoichiometrically deficient of ferric salt, leads to secondary growth (cross-linking) of the polypyrrole network, which could continue from 1 day to 30 days to produce conductive network polymers having varying degrees of crosslinking.

Example 14: Production of Polyaniline Gel Network Adhesive

The precursor of a conducting network polymer, such as crosslinkable polyaniline and polypyrrole, may contain a monomer, an initiator or catalyst, a crosslinking or gelating agent, an oxidizer and/or dopant. As an example, 3.6 ml aqueous solution A is prepared which contains 400 mM aniline monomer and 120 mM phytic acid. Subsequently, 1.2 ml solution B, containing 500 mM ammonium persulfate was added into the above solution A and subjected to bath sonication for 1 min. The resulting reactive suspension was cast onto a thermal film surface, which was then covered with another layer of graphitic film. (The procedure could be repeated for a desired number of times to produce a laminated graphitic layers having desired number of graphitic films.) In about 5 min, the in-situ polymerization of aniline monomer occurs to form the PANi hydrogel. The resulting film was cured at 50° C. in a vacuum oven for 2 hours to obtain a PANi network polymer.

We claim:

1. A laminated graphitic layer as an elastic heat spreader, said layer comprising:
   A) A plurality of graphitic films, graphene films, or both graphitic and graphene films, wherein said graphitic or graphene films comprise graphitic crystals or graphene planes substantially parallel to one another and parallel to a film plane and said graphitic or graphene films have a thermal conductivity of at least 200 W/mK, an electrical conductivity no less than 3,000 S/cm, and a physical density from 1.5 to 2.25 g/cm$^3$, all measured without the presence of a polymer; and
   B) A conducting polymer network adhesive that bonds together said graphitic or graphene films to form said laminated graphitic layer; wherein said conductive polymer network adhesive is in an amount from 0.001% to 30% by weight based on the total weight of the laminated graphitic layer;
   wherein said laminated graphitic layer has an in-plane thermal conductivity from 100 W/mK to 1,750 W/mK.

2. The laminated graphitic layer of claim 1, wherein said laminated graphitic layer has a fully recoverable tensile elastic strain from 1% to 50%.

3. The laminated graphitic layer of claim 1, wherein at least one of the graphene films comprises multiple graphene sheets that are substantially aligned to be parallel to one another and wherein said multiple graphene sheets contain graphene sheets selected from a pristine graphene material having essentially zero % of non-carbon elements, or a non-pristine graphene material having 0.001% to 25% by weight of non-carbon elements wherein said non-pristine graphene is selected from graphene oxide, reduced graphene oxide, graphene fluoride, graphene chloride, graphene bromide, graphene iodide, hydrogenated graphene, nitrogenated graphene, doped graphene, chemically functionalized graphene, or a combination thereof.

4. The laminated graphitic layer of claim 1, wherein said conducting polymer network comprises chains of a conjugated polymer selected from polyacetylene, polythiophene, poly(3-alkylthiophenes), polypyrrole, polyaniline, poly(isothianaphthene), poly(3,4-ethylenedioxythiophene), alkoxy-substituted poly(p-phenylene vinylene), poly(2,5-bis (cholestanoxy) phenylene vinylene), poly(p-phenylene vinylene), poly(2,5-dialkoxy)paraphenylene vinylene, poly [(1,4-phenylene-1,2-diphenylvinylene) ], poly(3',7'-dimethyloctyloxy phenylene vinylene), polyparaphenylene, polyparaphenylene, polyparaphenylene sulfide, polyheptadiyne, poly(3-hexylthiophene), poly(3-octylthiophene), poly(3-cyclohexylthiophene), poly(3-methyl-4-cyclohexylthiophene), poly(2,5-dialkoxy-1,4-phenyleneethynylene), poly(2-decyloxy-1,4-phenylene), poly(9,9-dioctylfluorene), polyquinoline, a derivative thereof, a copolymer thereof, or a combination thereof.

5. The laminated graphitic layer of claim 1, wherein said conducting polymer network comprises a polyaniline hydrogel, polypyrrole hydrogel, or polythiophene hydrogel polymer.

6. The laminated graphitic layer of claim 1, wherein said laminated graphitic layer has a thickness from 10 nm to 1,000 µm.

7. The laminated graphitic layer of claim 1, wherein the conducting polymer network adhesive further comprises a conductive material dispersed therein wherein the conductive material is selected from graphene sheets, expanded graphite flakes, carbon nanotubes, carbon nano-fibers, carbon black, acetylene black, nano-carbon particles, metal particles, metal nano-wires, carbon fibers, or a combination thereof.

8. The laminated graphitic layer of claim 1, wherein said graphitic film, when measured without said conducting polymer network adhesive, has an inter-graphene spacing less than 0.337 nm, a thermal conductivity of at least 1,300 W/mK, an electrical conductivity no less than 8,000 S/cm, and a physical density greater than 1.8 g/cm$^3$.

9. The laminated graphitic layer of claim 1, wherein said graphitic film, when measured without said conducting polymer network adhesive, has an inter-graphene spacing less than 0.336 nm, a thermal conductivity of at least 1,500 W/mK, an electrical conductivity no less than 10,000 S/cm, and a physical density greater than 2.0 g/cm$^3$.

10. The laminated graphitic layer of claim 1, wherein said graphitic or graphene film exhibits an inter-graphene spacing less than 0.337 nm and a mosaic spread value less than 1.0.

11. The laminated graphitic layer of claim 1, wherein said graphitic or graphene film exhibits a degree of graphitization no less than 60% and/or a mosaic spread value less than 0.7.

12. The laminated graphitic layer of claim 1, wherein said graphitic or graphene film exhibits a degree of graphitization no less than 90% and/or a mosaic spread value less than 0.4.

13. The laminated graphitic layer of claim 1, the graphitic or graphene films have a tensile strength no less than 300 MPa, a tensile modulus no less than 75 GPa, a thermal conductivity no less than 500 W/mK, and/or an electrical conductivity no less than 5,000 S/cm, all measured along a thin film plane direction.

14. The laminated graphitic layer of claim 1, the graphitic or graphene films have a tensile strength no less than 400 MPa, a tensile modulus no less than 150 GPa, a thermal conductivity no less than 800 W/mK, and/or an electrical conductivity no less than 8,000 S/cm, all measured along a thin film plane direction.

15. The laminated graphitic layer of claim 1, the graphitic or graphene films have a tensile strength no less than 500 MPa, a tensile modulus no less than 250 GPa, a thermal conductivity no less than 1,200 W/mK, and/or an electrical conductivity no less than 12,000 S/cm, all measured along a thin film plane direction.

16. The laminated graphitic layer of claim 1, the graphitic or graphene films have a tensile strength no less than 600 MPa, a tensile modulus no less than 350 GPa, a thermal conductivity no less than 1,500 W/mK, and/or an electrical conductivity no less than 20,000 S/cm, all measured along a thin film plane direction.

17. The laminated graphitic layer of claim 1, wherein said graphitic films comprise flexible graphite foil.

18. An electronic device containing the laminated graphitic layer of claim 1 as a thermal management element.

19. A structural member containing the laminated graphitic layer of claim 1 as a load-bearing and thermal management element.

20. A process for producing the laminated graphitic layer of claim 1, said process comprising:
  a) preparing a plurality of graphitic and/or graphene films;
  b) applying or disposing a thin film or coating of a reacting adhesive solution, a precursor to a conducting polymer network, at least between two of the graphitic or graphene films, wherein the reaction solution comprises an oligomer or a monomer, an initiator or catalyst, a curing or cross-linking agent, and/or a liquid solvent; and
  c) laminating the plurality of graphitic and/or graphene films together and polymerizing or crosslinking the reacting adhesive solution to form a conducting polymer network that bonds the films together to obtain the laminated graphitic layer.

21. The process of claim 20, wherein (a) comprises a procedure of forming a graphene film of an aggregate or cluster of multiple oriented and aligned graphene sheets that are substantially parallel to one another.

22. The process of claim 20, wherein (a) comprises a procedure of carbonizing and graphitizing a polymer film or pitch film to obtain a graphitic film.

* * * * *